United States Patent
Amitani

(10) Patent No.: US 9,024,244 B2
(45) Date of Patent: May 5, 2015

(54) RADIATION IMAGE CAPTURING APPARATUS WITH CONTROL DEVICE DETERMINING WHETHER DATA FLUCTUATION EXCEEDS A THRESHOLD

(75) Inventor: Kouji Amitani, Tachikawa (JP)

(73) Assignee: Konica Minolta Medical & Graphic, Inc. (JP)

( * ) Notice: Subject to any disclaimer, the term of this patent is extended or adjusted under 35 U.S.C. 154(b) by 307 days.

(21) Appl. No.: 13/545,107

(22) Filed: Jul. 10, 2012

(65) Prior Publication Data

US 2013/0015327 A1    Jan. 17, 2013

(30) Foreign Application Priority Data

Jul. 15, 2011   (JP) ................. 2011-156352

(51) Int. Cl.
*H01L 27/146* (2006.01)
*H04N 5/32* (2006.01)
*H04N 5/374* (2011.01)
*H04N 5/378* (2011.01)

(52) U.S. Cl.
CPC ..... *H01L 27/14618* (2013.01); *H01L 27/14632* (2013.01); *H01L 27/14663* (2013.01); *H04N 5/32* (2013.01); *H04N 5/374* (2013.01); *H04N 5/378* (2013.01)

(58) Field of Classification Search
CPC ............ H04N 5/335; H04N 5/32; G01J 1/44; G01J 1/32; G01J 1/04; G01T 1/24; G01T 1/2928; G01T 1/2018; G01T 1/20; G01N 23/04; G01N 2021/0168; A61B 6/032; A61B 6/482; A61B 6/488; A61B 6/54; A61B 6/542; A61B 6/545; A61B 6/548

USPC ........ 250/208.1, 214 R, 205, 370.08, 370.09, 250/370.11
See application file for complete search history.

(56) References Cited

U.S. PATENT DOCUMENTS

| | | | | |
|---|---|---|---|---|
| 6,797,960 | B1 * | 9/2004 | Spartiotis et al. | 250/370.09 |
| 7,211,802 | B1 * | 5/2007 | Dhurjaty et al. | 250/370.09 |
| 7,211,803 | B1 * | 5/2007 | Dhurjaty et al. | 250/370.09 |
| 8,664,615 | B2 * | 3/2014 | Amitani et al. | 250/370.09 |

FOREIGN PATENT DOCUMENTS

| | | | |
|---|---|---|---|
| JP | 6-342099 A | 12/1994 | |
| JP | 9-73144 A | 3/1997 | |
| JP | 2006-58124 A | 3/2006 | |
| JP | 2009-219538 A | 10/2009 | |
| WO | WO 2011016262 A1 * | 2/2011 | ............... H04N 5/32 |

* cited by examiner

Primary Examiner — Georgia Y Epps
Assistant Examiner — Carolynn A Moore
(74) Attorney, Agent, or Firm — Cantor Colburn LLP

(57) ABSTRACT

A control device of a radiation image capturing apparatus performs repeated reading of leak data prior to radiation image capturing operation and, when a threshold value has been exceeded by the leak data having been read out, said control device detects the start of irradiation. If there are periodic fluctuations in the leak data read out prior to radiation image capturing operation even though irradiation has not started, said control device determines whether or not a threshold value has been exceeded by a value obtained by subtracting a previously obtained fluctuation pattern of the leak data from the read-out leak data during a time period including at least a time period when the leak data fluctuates.

12 Claims, 27 Drawing Sheets

FIG. 9
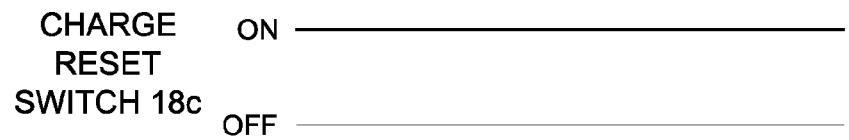
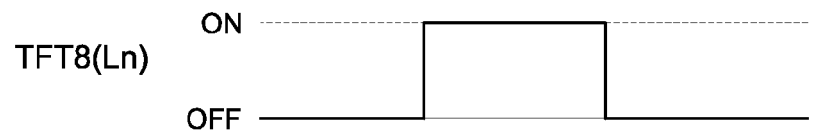
FIG. 10
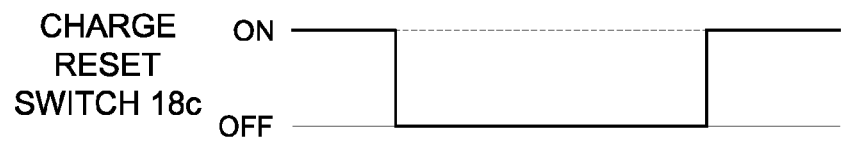
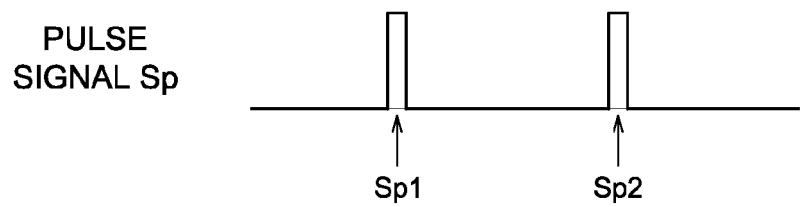
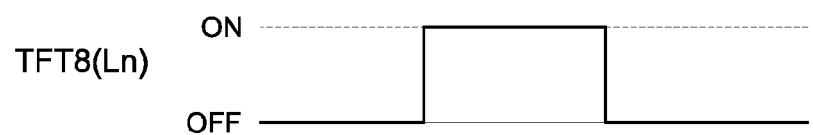

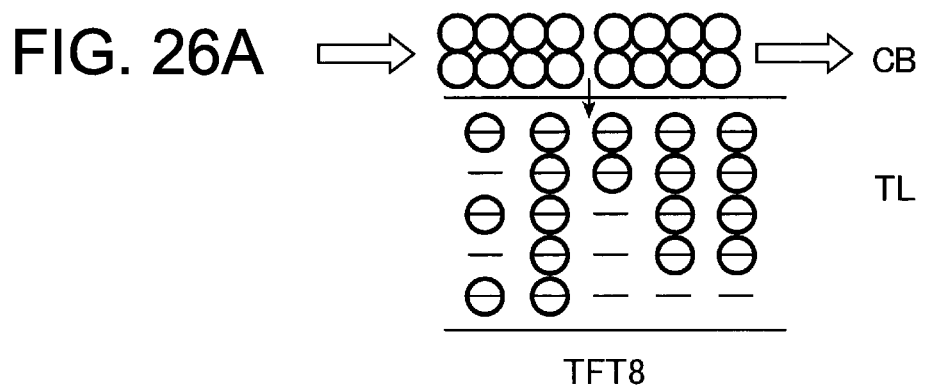
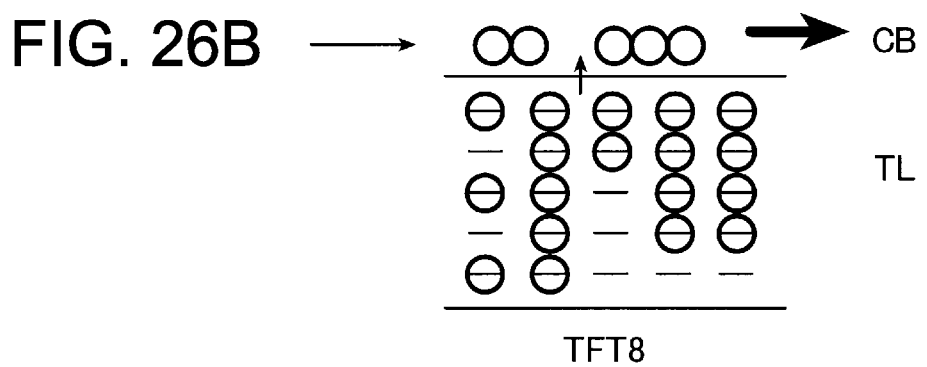

RADIATION IMAGE CAPTURING APPARATUS WITH CONTROL DEVICE DETERMINING WHETHER DATA FLUCTUATION EXCEEDS A THRESHOLD

This application is based on Japanese Patent Application No. 2011-156352 filed on Jul. 15, 2011 with Japan Patent Office, the entire content of which is hereby incorporated by reference.

BACKGROUND OF THE INVENTION

The present invention relates to a radiation image capturing apparatus, particularly to a radiation image capturing apparatus wherein the apparatus performs radiation image capturing operations by detecting irradiation by itself.

There has been development of various types of radiation image capturing apparatuses including a so-called direct type radiation image capturing apparatus that generates an electric charge through a detection element in response to the dosage of applied radiation such as X-rays and converts the electric charge into an electric signal, and a so-called indirect radiation image capturing apparatus that uses a scintillator etc. to convert the applied radiation into electromagnetic waves having other wavelengths such as visible light, then generates an electric charge through a photoelectric conversion element such as a photodiode in response to the energy of the electromagnetic wave having been converted and applied, and converts the electric charge into an electric signal (i.e., image data). In the following description of embodiments of the present invention, the detection element in the direct type radiation image capturing apparatus and the photoelectric conversion element in the indirect radiation image capturing apparatus will be collectively referred to as a radiation detection element.

This type of radiation image capturing apparatus is known under the name of FPD (Flat Panel Detector). In the conventional art, this radiation image capturing apparatus has been designed as a so-called exclusive device type formed integrally with the support base (refer to the Unexamined Japanese Patent Application Publication No. Hei 9 (1997)-73144, for example). In recent years, there has been development of portable radiation image capturing apparatuses wherein a radiation detection element and others are incorporated in a casing for easy transportation. These portable radiation image capturing apparatuses have been put into practical use (refer to Unexamined Japanese Patent Application Publication No. 2006-058124, and Unexamined Japanese Patent Application Publication No. Hei 6 (1994)-342099).

In the aforementioned radiation image capturing apparatus, a plurality of radiation detection elements 7 are normally arranged in a two-dimensional array (matrix) on a detecting section P, and each radiation detection element 7 is connected with the switch unit formed of a thin film transistor (hereinafter referred to as "TFT") 8, as shown in FIG. 7 to be described later.

Normally in the radiation image capturing operation, radiation is applied to a radiation image capturing apparatus from a radiation source of a radiation generator, with a prescribed image capturing position (front of the chest or side of the lumbar spine) of the body of a subject placed in-between.

In this case, off-voltage is applied to the lines L1 through Lx of the scanning line 5 from the gate driver 15b of the scanning drive unit 15 of the radiation image capturing apparatus. When all the TFTs 8 have been set to the off-state, radiation is applied, whereby an electric charge generated within each radiation detection element 7 by application of radiation is stored appropriately inside each radiation detection element 7.

After radiation image capturing operation, on-voltage is applied sequentially to each of the lines L1 through Lx of the scanning line 5 from the gate driver 15b so that TFTs 8 are sequentially turned on. The electric charge accumulated in each radiation detection element 7 by application of radiation is sequentially discharged to each of the signal lines 6. This electric charge is then read out as image data D by each reading circuit 17.

Incidentally, to ensure radiation image capturing, it is required that, when radiation is applied to the radiation image capturing apparatus, off-voltage should be properly applied to each of the lines L1 through Lx of the scanning line 5 from the gate driver 15b, and TFTs 8 as switch unit should be turned off, as described above.

In many of the conventional exclusive equipment type radiation image capturing apparatuses, for example, an interface is provided for connection with the radiation generator so that signals are exchanged. Then the radiation image capturing apparatus applies off-voltage to each of the lines L1 through Lx of the scanning line 5. When the charge accumulation state has been confirmed, the radiation image capturing apparatus allows radiation to be applied from the radiation source.

However, for example, when the radiation image capturing apparatus and radiation generator have been produced by different manufacturers, it is not always easy to provide interface between these devices. In some cases, an interface cannot be provided.

If an interface cannot be configured between the radiation image capturing apparatus and radiation generator, the radiation image capturing apparatus has no means of identifying the time when radiation was applied from the radiation source. This requires the radiation image capturing apparatus to detect by itself whether or not radiation has been applied from the radiation source.

To solve this problem, in recent years, it has been known that development of various radiation image capturing apparatuses capable of self-detection of the application of radiation, independently of the aforementioned interface configured between the radiation image capturing apparatus and radiation generator.

For example, according to the inventions proposed in the Specification of the U.S. Pat. No. 7,211,803 and the Unexamined Japanese Patent Application Publication No. 2009-219538, when exposure of the radiation image capturing apparatus to radiation has started, and electric charge has been generated inside each radiation detection element 7, electric charge flows from each radiation detection element 7 to the bias line 9 (refer to FIG. 7 to be described later) connected to each radiation detection element 7, with the result that there is an increase in the volume of current running through the bias line 9. It is proposed that to utilize this phenomenon effectively, the bias line 9 is provided with a current detection unit to detect the value of the current flowing through the bias line 9 and that thus, the start of irradiation is detected based on this current value.

According to the research made by the present inventors, however, it has been found out that since the aforementioned technique uses a bias line 9 connected to the electrode of each radiation detection element 7, noise generated by the current detection unit is transmitted to each radiation detection element 7 through the bias line 9, and is superimposed on the image data D read out of the radiation detection element 7 in some cases and that solution to the problem is not easy.

In the meantime, after extended research on an alternative method that enables the start of irradiation to be detected by the radiation image capturing apparatus, the present inventors have found out several techniques that enable the radiation image capturing apparatus to detect the start of irradiation appropriately by itself.

As will be described later, a new irradiation start detection method found out by the present inventors is designed in such a way that, prior to radiation image capturing operation, on-voltage is sequentially applied to each of the lines L1 through Lx of the scanning line 5 from the gate driver 15b of the scanning drive unit 15 so that image data "d" is read out. It should be noted that, in the following description, the image data to be read for detection of the start of irradiation prior to this radiation image capturing will be called image data "d" for irradiation start detection, for distinction from the image data D which is a main image to be read immediately after image capturing.

When radiation is applied to the radiation image capturing apparatus, there is an increase in the value of the image data "d" for irradiation start detection to be read. This phenomenon is used in such a way that the start of irradiation to the radiation image capturing apparatus is detected based on the image data "d" for irradiation start detection having been read.

Further, in the another irradiation start detection method found out by the present inventors, off-voltage is applied to all the scanning lines 5 from the gate driver 15b of the scanning drive unit 15 prior to radiation image capturing so that each of the TFTs 8 is turned off. Under this condition, the reading circuit 17 is made to perform the step of reading. Then the step of reading leak data "d leak" is performed in such a way that the electric charge "q" (refer to FIG. 13 to be described later) having leaked from the radiation detection element 7 through the TFTs 8 is converted into the leak data "d leak".

In this case as well, when radiation has been applied to the radiation image capturing apparatus, there is an increase in the value of the leak data "d leak" to be read. This phenomenon is utilized so that the start of irradiation of the radiation image capturing apparatus is detected based on the value of the leak data "d leak" having been read.

In this case, the above-mentioned leak data "d leak" or the image data "d" for detecting the start of irradiation are provided with threshold value "d leak_th" or threshold value "dth" in advance. When the read-out leak data "d leak" or image data "d" has exceeded the threshold value "d leak_th" or "dth", start of irradiation on the radiation image capturing apparatus is detected.

However, the further study by the present inventors has revealed that periodic fluctuations are sometimes found in the values of the leak data "d leak" or the image data "d" for detecting the start of irradiation read out by the radiation image capturing apparatus prior to radiation image capturing operation. It has also been found out that such periodic fluctuations in the read-out value of the leak data "d leak" or image data "d" may allow the threshold value "d leak_th" or "d th" to be exceeded even though radiation is not applied to the radiation image capturing apparatus when there is a large fluctuation in the leak data "d leak" or image data "d". This may lead to incorrect detection of the start of irradiation.

As described above, when the radiation image capturing apparatus itself detects the start of irradiation based on the leak data "d leak" or image data "d" for detecting the start of irradiation, the radiation image capturing apparatus subsequent to the start of irradiation automatically transfers to the state of electric charge accumulation wherein the electric charge generated in the radiation detection element 7 by the irradiation is accumulated in the radiation detection element 7, as will be described later. After that, a step is taken to read out the image data D as the main image from each radiation detection element 7.

As described above, if there is an incorrect detection of the start of irradiation by the radiation image capturing apparatus, a series of processing such as transfer to the state of electric charge accumulation and reading of the image data D as the main image is performed automatically. Thus, for example, when a radiographing technician wishes to use this radiation image capturing apparatus to perform radiation image capturing operation, he cannot perform capturing operation using the radiation image capturing apparatus until completion of the above-mentioned series of processing.

Further, when the radiation image capturing apparatus has a battery built therein, power will be consumed by incorrect detection in the processing such as transfer to the state of electric charge accumulation and reading of the image data D as the main image. This may result in unwanted consumption of battery, and may reduce the number of radiation images captured in one step of battery charging. This may cause a reduction in the image capturing efficiency for each charging operation.

SUMMARY

In view of the problems described above, it is an object of the present invention to provide a radiation image capturing apparatus capable of completely avoiding the possibility of incorrect detection of the start of irradiation caused by a possible periodic fluctuation in the leak data read and the image data for detecting start of irradiation prior to radiation image capturing operation.

To solve at least one of the aforementioned problems, a radiation image capturing apparatus reflecting one aspect of the present invention includes:

a detecting section including:
  a plurality of scanning lines and a plurality of signal lines provided to cross each other; and
  a plurality of radiation detection elements arranged in a two-dimensional array in small regions partitioned by the plurality of scanning lines and the plurality of signal lines;
a scanning drive unit which sequentially applies on-voltage to each of the scanning lines by switching the scanning lines to which the on-voltage is applied;
switch units each connected to each of the scanning lines so as to discharge electric charge accumulated in the radiation detection elements to the signal lines when the on-voltage is applied;
reading circuits which are connected to the plurality of signal lines and which convert the electric charge discharged from the radiation detection elements, into image data to read out the image data; and
a control device for controlling at least the scanning drive unit and the reading circuits to perform reading out the image data from the radiation detection elements,
wherein the control device is configured to allow the reading circuits to repeat reading out leak data prior to the radiation image capturing operation by converting the electric charge having leaked from each of the radiation detection elements through the switch units into the leak data after turning off each of the switch units by allowing the scanning drive unit to apply off-voltage to all of the scanning lines, and the control device is configured to detect a start of irradiation when the leak data read out by the reading circuits has exceeded a threshold value, and wherein when the leak data read out prior to the radiation image capturing operation fluctuates periodically even though the irradiation has not started, the control device determines whether or not a value obtained by subtracting a previously obtained fluctuation pattern of the leak data from the read-out leak data has exceeded the threshold value, during a time period including at least a time period when the leak data fluctuates.

A radiation image capturing apparatus in another embodiment of the present invention includes:
a detecting section including:
a plurality of scanning lines and a plurality of signal lines provided to cross each other; and
a plurality of radiation detection elements arranged in a two-dimensional array in small regions partitioned by the plurality of scanning lines and the plurality of signal lines;
a scanning drive unit which sequentially applies on-voltage to each of the scanning lines by switching the scanning lines to which the on-voltage is applied;
switch units each connected to each of the scanning lines so as to discharge electric charge accumulated in the radiation detection elements to the signal lines when the on-voltage is applied;
reading circuits which are connected to the plurality of signal lines and which convert the electric charge discharged from the radiation detection elements, into image data to read out the image data; and
a control device for controlling at least the scanning drive unit and the reading circuits to perform reading out the image data from the radiation detection elements,
wherein the control device is configured to allow the reading circuits to repeat reading out image data for detecting a start of irradiation prior to the radiation image capturing operation by allowing the scanning drive unit to sequentially apply on-voltage to each of the scanning lines, and detects the start of irradiation when the read-out image data for detecting the start of irradiation has exceeded a threshold value, and
wherein when the image data for detecting the start of irradiation read out prior to the radiation image capturing operation fluctuates periodically even though the irradiation has not started, the control device determines whether or not a value obtained by subtracting a previously obtained fluctuation pattern of the image data for detecting the start of irradiation from the read-out image data for detecting the start of irradiation has exceeded the threshold value, during a time period including at least a time period when the image data for detecting the start of irradiation fluctuates.

BRIEF DESCRIPTION OF THE DRAWINGS

FIG. 9 is a timing chart showing the on-off timing for the charge reset switch and TFT in the step of resetting each radiation detection element.
FIG. 10 is a timing chart showing the on-off timing of the charge reset switch, pulse signal and TFT in the step of reading the image data.
FIG. 26A is a diagram showing that, in the step of resetting each radiation detection element, electric charge is trapped at the trap level of the TFT,
and FIG. 26B is a diagram showing that, in the step of reading the leak data, part of the electric charge is transferred to the conduction band from the trap level.

DETAILED DESCRIPTION OF THE PREFERRED EMBODIMENT

The following describes the embodiments of the radiation image capturing apparatus in the present invention with reference to the drawings.

The following describes a so-called indirect radiation image capturing apparatus that is provided with a scintillator or the like as a radiation image capturing apparatus, wherein the applied radiation is converted into electromagnetic waves of other wavelengths such as visible light, whereby an electric signal is obtained. However, the present invention is also applicable to the so-called direct type radiation image capturing apparatus that detects radiation directly by a radiation detection element without using a scintillator or others.

Figure 1:
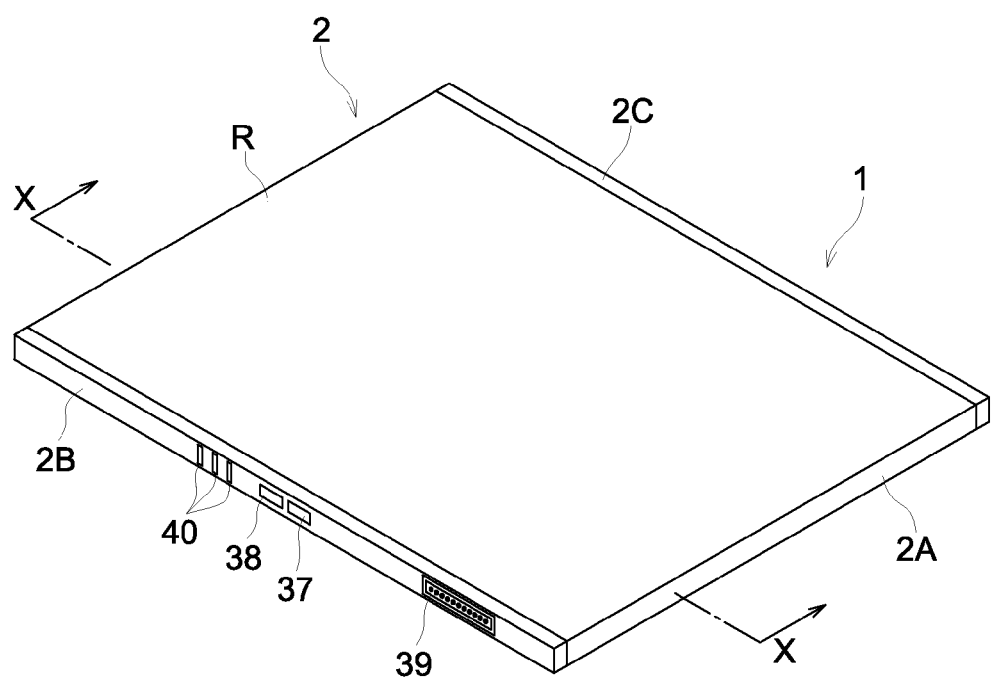
FIG. 1 is a perspective view representing the external appearance of a radiation image capturing apparatus of the present embodiment.
Figure 2:
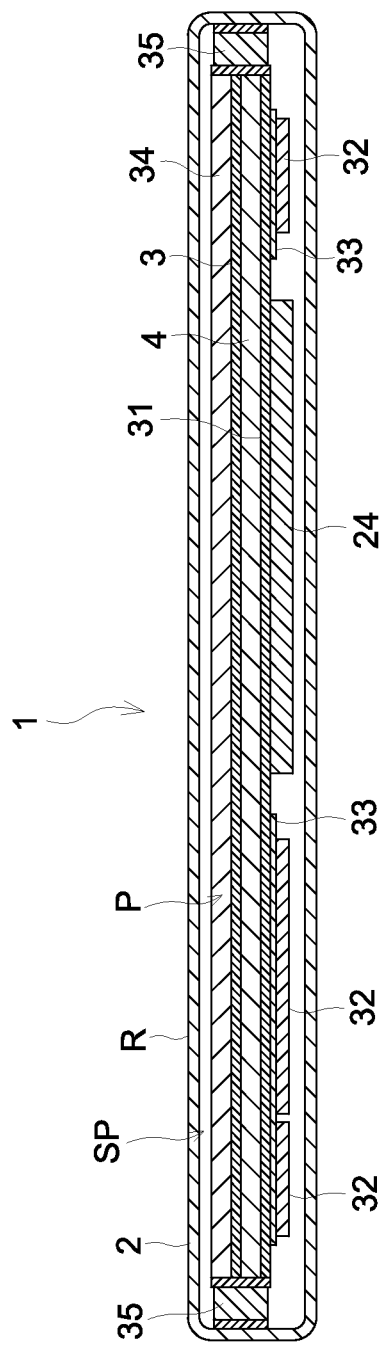
FIG. 2 is a cross section taken along arrow line X-X in FIG. 1.

FIG. 1 is a perspective view representing the external appearance of a radiation image capturing apparatus of the present embodiment. FIG. 2 is a cross section taken along arrow line X-X in FIG. 1. In the radiation image capturing apparatus 1, as shown in FIGS. 1 and 2, a sensor panel SP composed of a scintillator 3 and substrate 4 are incorporated in a casing 2.

In the present embodiment, in the casing 2, a hollow rectangular sleeve-shaped casing main body 2A having a radiation incidence surface R is made of such a material as a carbon board and plastics that allows passage of radiation. The casing 2 is formed by blocking the openings on both sides of the casing main body 2A with cover members 2B and 2C. Instead of the formation of so-called a monocoque-type of the casing 2, so-called a lunch box-type formed of a front plate and back plate for example can be employed.

Further, the cover member 2B on one side of the casing 2 is provided with a power switch 37, change-over switch 38, connector 39, and indicator 40 composed of a LED or the like for indicating the battery status and operating conditions of the radiation image capturing apparatus 1.

Figure 3:
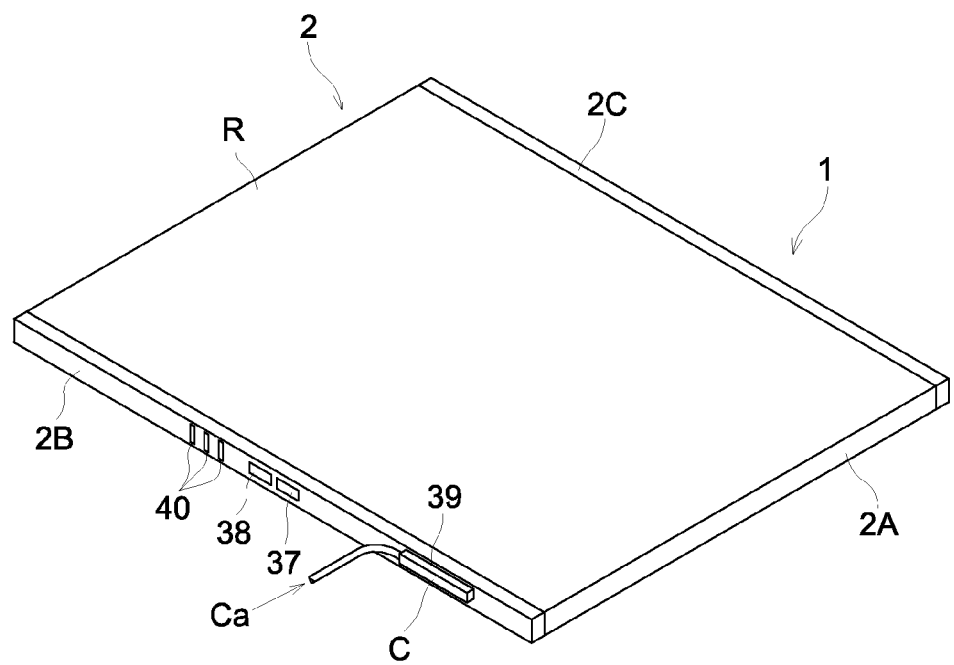
FIG. 3 is a perspective view representing the state where the cable connector is linked to the connector of the radiation image capturing apparatus.

In the present embodiment, as shown in FIG. 3, the connector 39 is connected with the connector C provided on the tip end of the cable Ca. This allows the connector 39 to serve as a wired type communication unit when exchanging signals with an apparatus such as an external console and others through a cable Ca or sending the image data D and others. It should be noted that the installation position of the connector 39 is not restricted to the cover member 2B. The connector 39 can be installed at a proper position of the radiation image capturing apparatus 1.

Further, although not illustrated, an antenna device 41 refer to (FIG. 7, to be described later) is installed on the cover member 2C and others on the opposite side of the casing 2 so as to be embedded into the cover member 2C and others. In the present embodiment, this antenna device 41 serves as a communication unit for wireless exchange of signals and others, for example, between the radiation image capturing apparatus 1 and console or others.

It should be noted that the installation position of the antenna device 41 is not restricted to the cover member 2C. The antenna device 41 can be installed at any position of the radiation image capturing apparatus 1. Further, the number of the antenna devices 41 is not restricted to one. A plurality of antenna devices 41 can be installed.

Inside the casing 2, as shown in FIG. 2, a base 31 is arranged below the substrate 4 through a thin lead plate (not illustrated) and others. The base 31 is provided with a PCB 33 equipped with electronic parts 32 and others, and a battery 24. Further, the radiation incidence surfaces R of the substrate 4 and scintillator 3 are provided with glass substrates 34 for protection. Further, in the present embodiment, a cushioning material 35 is provided between lateral sides of the sensor panel SP and casing 2 to prevent mutual collision.

The scintillator 3 is installed opposed to the detecting section P (to be described later) of the substrate 4. In the present embodiment, the scintillator 3 is mainly composed of a phospher, for example. Upon receipt of radiation, the scintillator 3 converts the radiation into an electromagnetic wave having a wavelength of 300 through 800 nm, i.e., an electromagnetic wave mainly consisting of visible light and outputs this electromagnetic wave.

Figure 4:
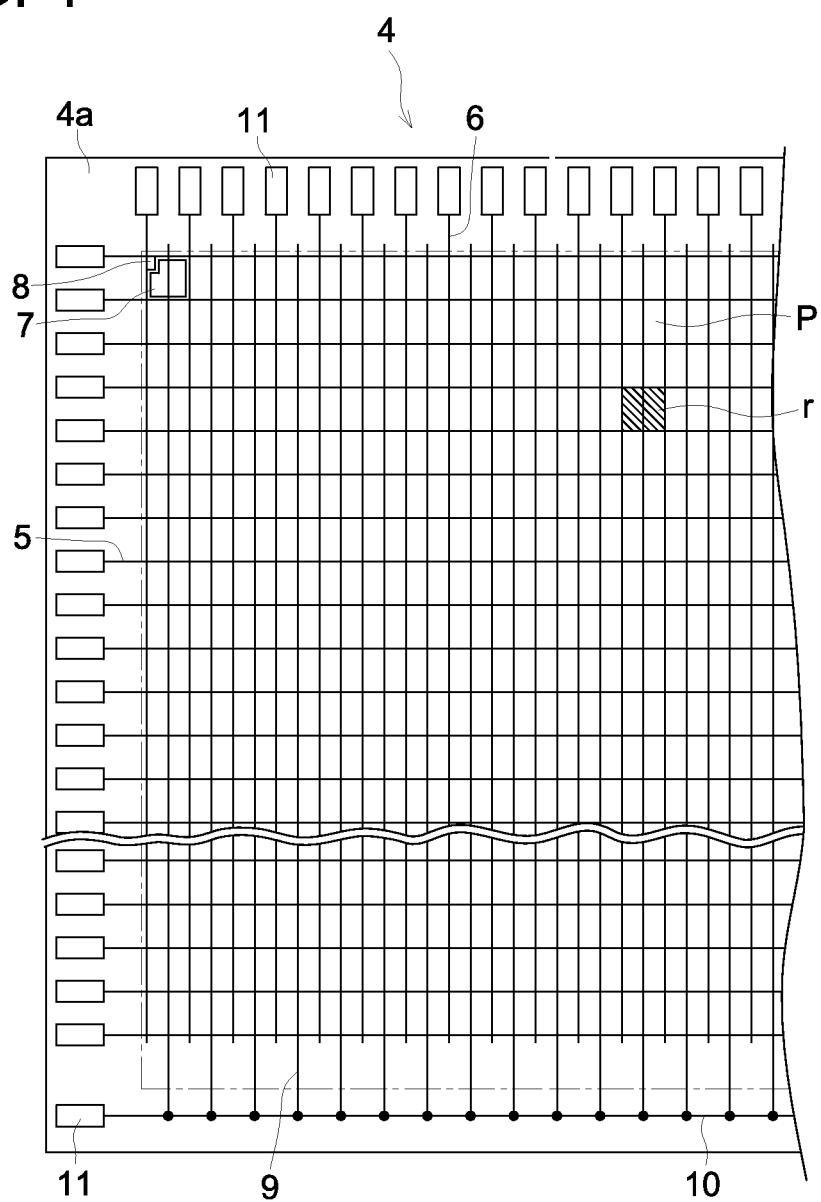
FIG. 4 is a plan view showing the structure of the substrate of the radiation image capturing apparatus.

In the present embodiment, the substrate 4 is formed of a glass substrate. As shown in FIG. 4, a plurality of scanning lines 5 and a plurality of signal lines 6 are arranged on the surface 4a of the substrate 4 on the side opposed to the scintillator 3 so as to cross each other.

A radiation detection element 7 is provided in each of the small regions "r" partitioned by a plurality of scanning lines 5 and a plurality of signal lines 6 on the surface 4a of the substrate 4. As described above, the detecting section P is defined as all of the small regions "r", which are partitioned by scanning lines 5 and signal lines 6 and provided with a plurality of radiation detection elements 7 in a two-dimensional array i.e., the entire region indicated by the one-dot chain line in FIG. 4.

Figure 5:
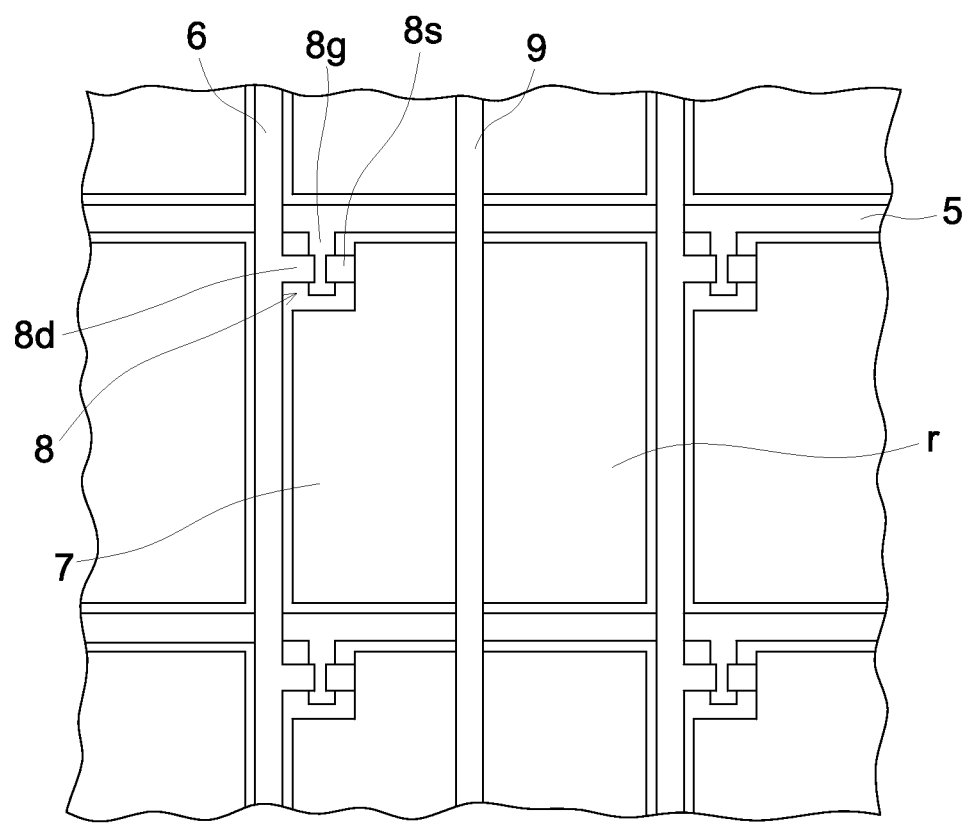
FIG. 5 is an enlarged view showing the structure of the radiation detection elements, TFTs and others formed on the small region on the substrate in FIG. 4.

In the present embodiment, a photodiode is used as the radiation detection element 7. It is also possible to use a phototransistor, for example. Each radiation detection element 7 is connected to the source electrode 8s of the TFT 8 which is a switch unit as shown in FIG. 5 as an enlarged view of FIG. 4. The drain electrode 8d of the TFT 8 is connected to the signal line 6.

Radiation enters the radiation detection element 7 from the radiation incidence surface R of the casing 2 of the radiation image capturing apparatus 1. An electron-hole pair is produced inside when exposed to the electromagnetic wave such as visible light obtained by conversion from the radiation by the scintillator 3. The radiation detection element 7 converts the applied radiation (electromagnetic wave obtained by conversion from radiation by the scintillator 3 in the present embodiment) into electric charges.

The TFT 8 is turned on when on-voltage is applied to the gate electrode 8g from the scanning drive unit 15 (to be described later) through the scanning line 5. Electric charges stored in the radiation detection element 7 are discharged to the signal line 6 through the source electrode 8s and drain electrode 8d. Further, the TFT 8 is turned off when off-voltage is applied to the gate electrode 8g through the connected scanning line 5. This suspends discharge of electric charges from the radiation detection element 7 to the signal line 6 so that electric charges are accumulated inside the radiation detection element 7.

In the present embodiment, one bias line 9 is connected to a plurality of radiation detection elements 7 arranged in rows, as shown in FIG. 5. As illustrated in FIG. 4, each bias line 9 is provided parallel to the signal line 6. Bias lines 9 are united by the wiring 10 outside the detecting section P of the substrate 4.

Figure 6:
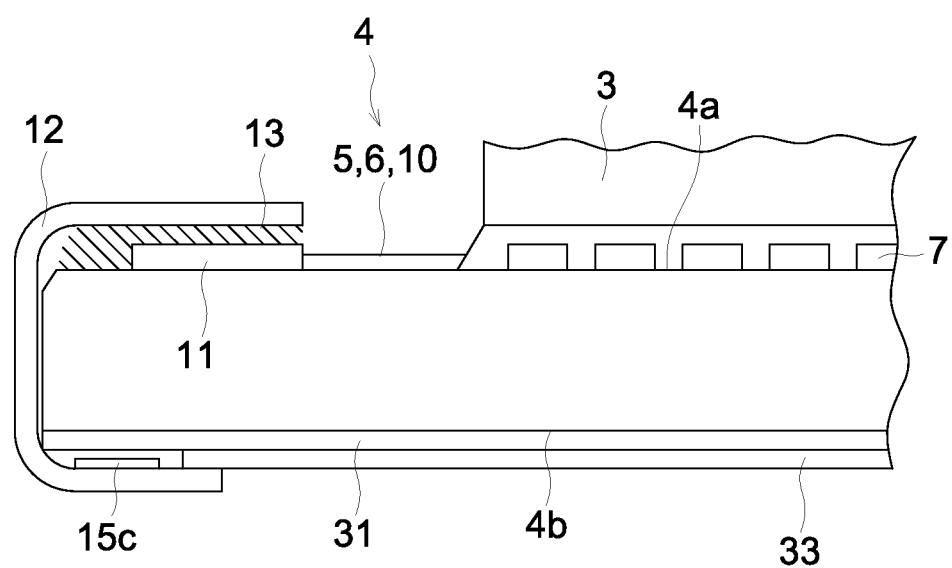
FIG. 6 is a side view showing the substrate on which a flexible circuit substrate and PCB are installed.

In the present embodiment, each scanning line 5, signal line 6 and the wiring 10 of bias line 9 is connected to the input/output terminal (also called a pad) 11 provided close to the edge of the substrate 4, as shown in FIG. 4. As shown in FIG. 6, each input/output terminal 11 is connected with a flexible circuit substrate (also-called a Chip On Film) 12, wherein the chip of the gate IC 15c and others constituting the gate driver 15b of the scanning drive unit 15 (to be described later) are built on the film, through such an anisotropic conductive adhesive agent 13 as an anisotropic conductive film and anisotropic conductive paste.

The flexible circuit substrate 12 is routed to the reverse side 4b of the substrate 4, and is connected with the aforementioned PCB 33 on the reverse side 4b. The sensor panel SP of the radiation image capturing apparatus 1 is formed in this manner. It should be noted that electronic parts 32 are not illustrated in FIG. 6.

Figure 7:
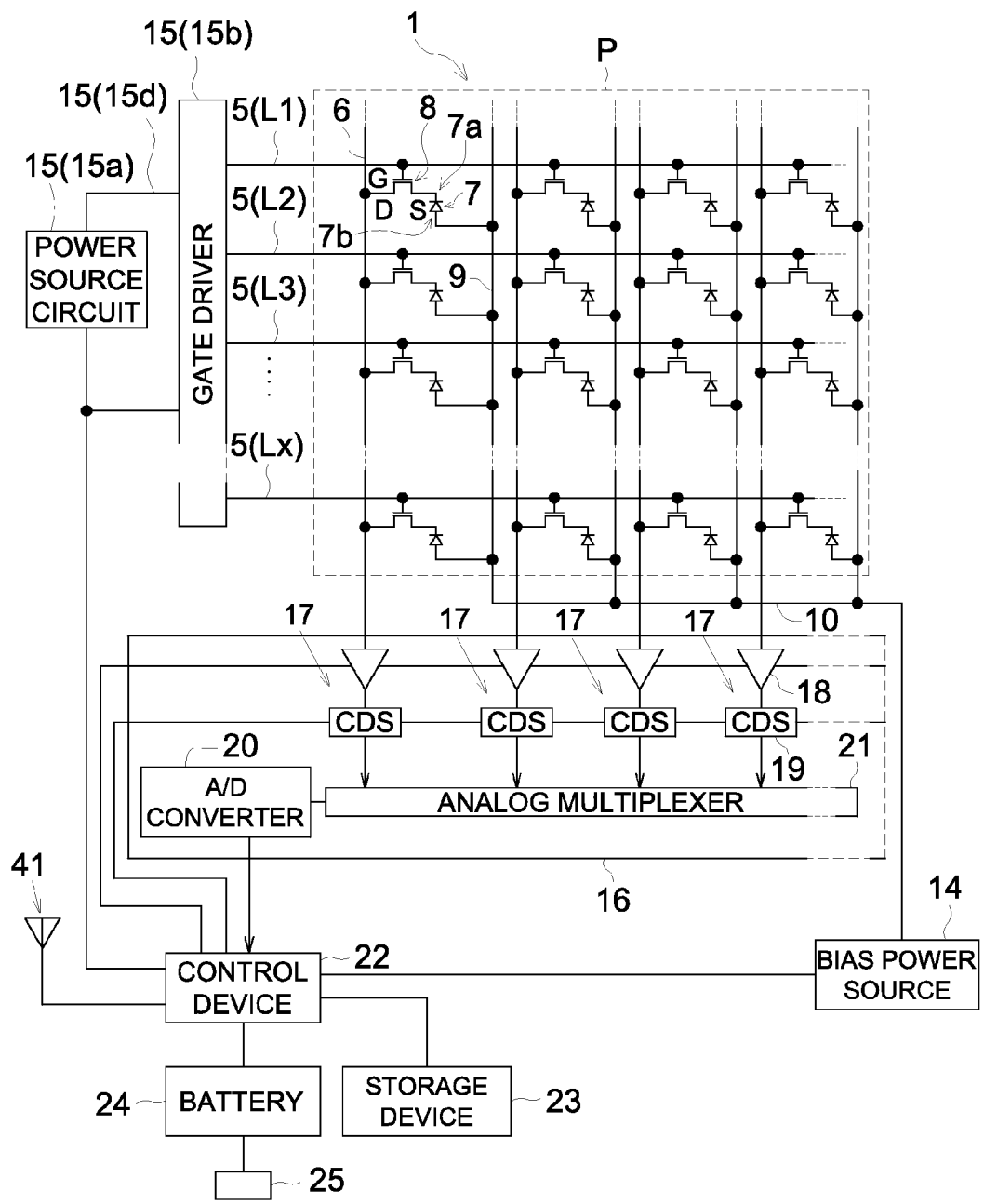
FIG. 7 is a block diagram showing the equivalent circuit of the radiation image capturing apparatus.
Figure 8:
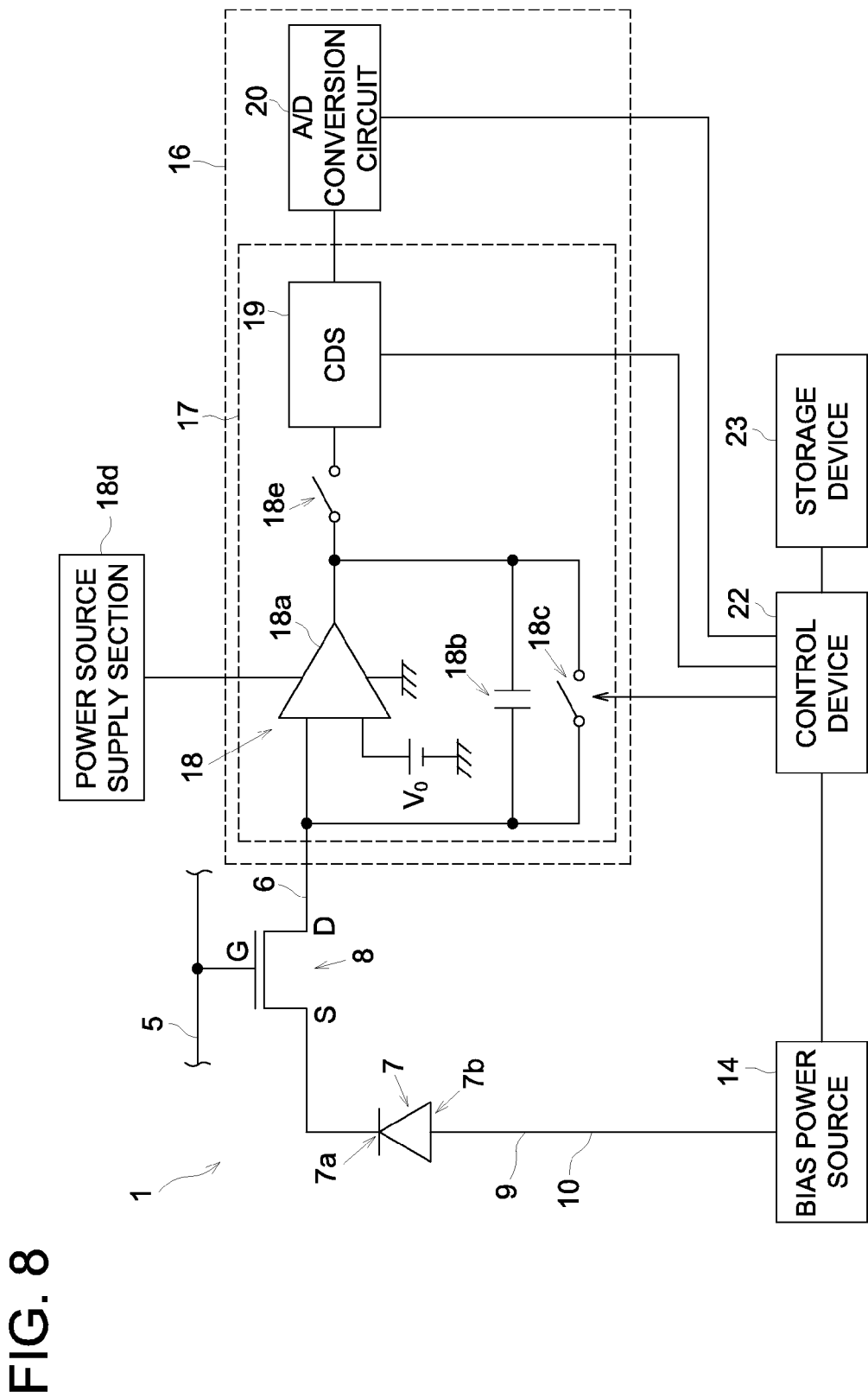
FIG. 8 is a block diagram showing the equivalent circuit for one pixel constituting the detecting section.

The following describes the structure of the circuit of the radiation image capturing apparatus 1. FIG. 7 is a block diagram showing the equivalent circuit of the radiation image capturing apparatus 1. FIG. 8 is a block diagram showing the equivalent circuit for one pixel constituting the detecting section P As described above, in each radiation detection element 7 of the detecting section P of the substrate 4, a bias line 9 is connected to each of the second electrodes 7b. Bias lines 9 are united by the wiring 10, and are connected to the bias power source 14. The bias power source 14 applies bias voltage to the second electrode 7b of each radiation detection element 7 through the wiring 10 and each of bias lines 9. Further, the bias power source 14 is connected to the control device 22 (to be described later) so as to control the bias voltage to be applied to each radiation detection element 7 from the bias power source 14 by the control device 22.

As shown in FIGS. 7 and 8, in the present embodiment, voltage (so-called inverse bias voltage) equal to or less than the voltage applied to the first electrode 7a of the radiation detection element 7 is applied from the bias power source 14 as bias voltage to the second electrode 7b of the radiation detection element 7 through the bias line 9.

The scanning drive unit 15 is provided with a power source circuit 15a for supplying on-voltage and off-voltage to the gate driver 15b through the wiring 15d, and a gate driver 15b for switching between on-voltage and off-voltage to be applied to each of the lines L1 through Lx of the scanning line 5 so that the on/off state of each of the TFTs 8 is switched. In the present embodiment, the gate driver 15b is constituted by a plurality of the aforementioned gates IC 15c (FIG. 6) installed in parallel.

As shown in FIGS. 7 and 8, the signal lines 6 are connected to the reading circuits 17 incorporated in the reading IC 16, respectively. The reading circuit 17 includes an amplification circuit 18 and correlated dual sampling circuit 19. The reading IC 16 further incorporates an analog multiplexer 21 and A/D conversion circuit 20. It should be noted that, in FIG. 7 and FIG. 8, the correlated dual sampling circuit 19 is represented as CDS. Further, in FIG. 8, the analog multiplexer 21 is not illustrated.

In the present embodiment, the amplification circuit 18 includes operation amplifier 18a, the capacitor 18b and charge reset switch 18c connected parallel to the operation amplifier 18a and a charge amplifier circuit equipped with a power source supply section 18d for supplying power to the operation amplifier 18a and others. A signal line 6 is connected to the reverse input terminal on the input side of the operation amplifier 18a of the amplification circuit 18. A base voltage $V_0$ is applied to the non-reverse input terminal on the input side of the amplification circuit 18. It should be noted that the base voltage $V_0$ is set to an appropriate value. In the present embodiment, a base voltage $V_0$ of 0 volt is applied, for example.

Further, the charge reset switch 18c of the amplification circuit 18 is connected to the control device 22, and is placed under the on/off control by the control device 22. Further, a switch 18e that switches synchronous with the charge reset switch 18c is installed between the operation amplifier 18a and correlated dual sampling circuit 19. The switch 18e is turned on or off synchronous with the on-off operation of the charge reset switch 18c.

When performing the step of resetting each radiation detection element 7 to remove electric charges remaining in each radiation detection element 7 in the radiation image capturing apparatus 1, each of the TFTs 8 is turned on while the charge reset switch 18c is kept turned on (and the switch 18e is turned off), as shown in FIG. 9.

Then electric charge is discharged to the signal line 6 from each radiation detection element 7 through each of the TFTs 8 having been turned on. Passing through the charge reset switch 18c of the amplification circuit 18, the electric charge flows through the operation amplifier 18a from the output terminal side of the operation amplifier 18a and comes out of the non-reverse input terminal to the ground, or flows out to the power source supply section 18d. In this manner, each radiation detection element 7 is subjected to resetting processing.

At the time of reading of image data D from each radiation detection element 7, the electric charge is discharged to the signal line 6 from each radiation detection element 7 through each of the TFTs 8 being turned on, while the charge reset switch 18c of the amplification circuit 18 is kept turned off (and switch 18e kept turned on), as shown in FIG. 10. Then the electric charge is accumulated in the capacitor 18b of the amplification circuit 18.

In the amplification circuit 18, the voltage value in conformity to the amount of the electric charge accumulated in the capacitor 18b is outputted from the output side of the operation amplifier 18a. The electric charge flowing out of each radiation detection element 7 is subjected to charge voltage conversion by the amplification circuit 18.

When the pulse signal Sp1 (FIG. 10) has been sent from the control device 22 before the electric charge flows out of each radiation detection element 7, the correlated dual sampling circuit (CDS) 19 arranged on the output side of the amplification circuit 18 retains the voltage value Vin outputted from the amplification circuit 18 at this moment. When a pulse signal Sp2 is sent from the control device 22 after the electric charge having flown out of the each radiation detection element 7 has been accumulated in the capacitor 18b of the amplification circuit 18, the correlated dual sampling circuit (CDS) 19 retains the voltage value Vfi outputted from the amplification circuit 18 at this moment.

When the voltage value Vfi is retained by means of the second pulse signal Sp2, the correlated dual sampling circuit 19 calculates the difference Vfi−Vin of the voltage value, and outputs the calculated difference Vfi−Vin downstream as image data D of the analog value. The image data D of each radiation detection element 7 outputted from the correlated dual sampling circuit 19 is sequentially sent to the A/D conversion circuit 20 through the analog multiplexer 21. After having been converted to the image data D of digital value sequentially by the A/D conversion circuit 20, the image data D is outputted to the storage device 23 and is stored sequentially.

Upon completion of one reading process of the image data D, charge reset switch 18c of the amplification circuit 18 is turned on (FIG. 10), and the electric charge accumulated in the capacitor 18b is discharged. Similarly to the above, the discharged electric charge passes through the operation amplifier 18a from the output terminal side of the operation amplifier 18a and comes out of the non-reverse input terminal to enter the ground or flows out into the power source supply section 18d. Then the amplification circuit 18 is reset.

The control device 22 includes the unillustrated CPU (Central Processing Unit), ROM (Read Only Memory), RAM (Random Access Memory), computer connected with an input/output interface through a bus, and FPGA (Field Programmable Gate Array). The control device 22 can be formed of an exclusive control circuit. The control device 22 controls the operation of each component members of the radiation image capturing apparatus 1. Further, as shown in FIG. 7, the control device 22 is connected with the storage device 23 including a SRAM (Static RAM), SDRAM (Synchronous DRAM) and others.

In the present embodiment, the control device 22 is connected with the aforementioned antenna device 41, and a battery 24 for supplying power to the components such as a detecting section P, scanning drive unit 15, reading circuit 17, storage device 23, and a bias power source 14. The battery 24 is provided with a connection terminal 25 for recharging the battery 24 by supplying the power to the battery 24 from a charging device (not illustrated).

As described above, the control device 22 controls the scanning drive unit 15 and reading circuit 17 so as to conduct reading processing of image data D or resetting processing of the radiation detection element 7 or the like, and controls the operation of the functioning components of the radiation image capturing apparatus 1, for example, by controlling the bias power source 14 to set or adjust the bias voltage applied to each radiation detection element 7 from the bias power source 14.

[Control Configuration for Detecting the Start of Irradiation (Detection Method A)]

The following describes the control configuration for detecting the start of irradiation in the control device 22 of the radiation image capturing apparatus 1.

In the present embodiment, as described above, the radiation image capturing apparatus 1 itself detects that radiation has been applied from a radiation generator. The following describes the method of detecting the start of irradiation in the radiation image capturing apparatus 1 according to the present embodiment.

The detection method in the present embodiment has been newly found out in the research and development efforts made by the present inventors. This is different from the method described in the Specification of the aforementioned U.S. Pat. No. 7,211,803 or the Unexamined Japanese Patent Application Publication No. 2009-219538, wherein a current detection unit is provided in the system, and the start of irradiation is detected based on the output value from the current detection unit.

As a new detection method found out by the present inventors, either one of the following two detection methods can be adopted, for example.

[Detection Method 1]

Figure 11:
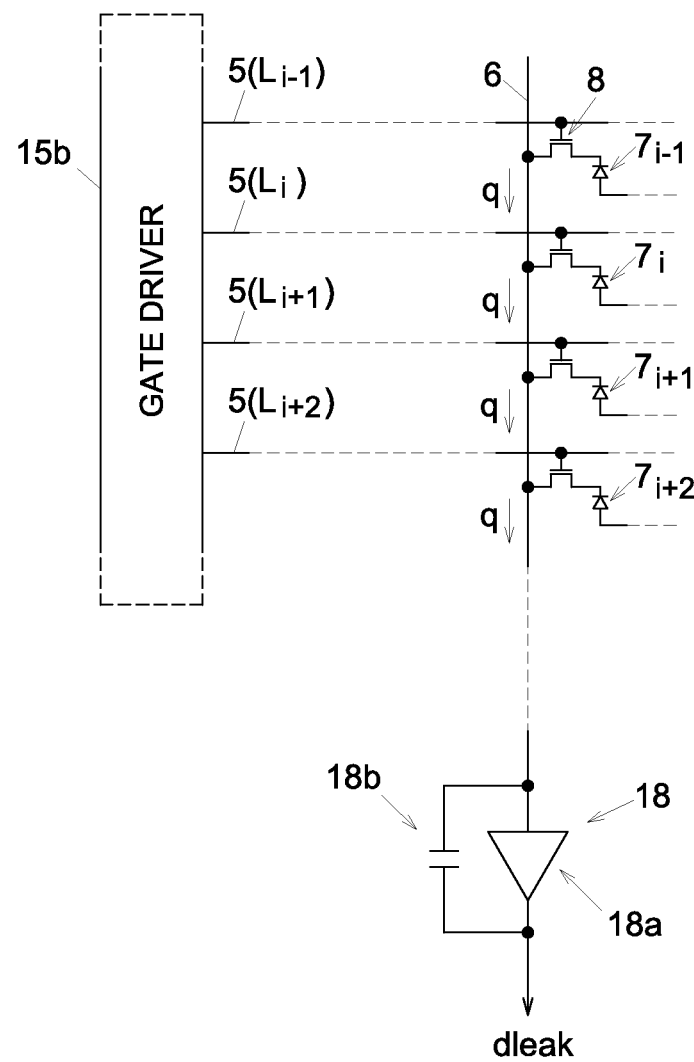
FIG. 11 is a diagram showing how the electric charge leaking from the radiation detection element through the TFT is read out as leak data.

For example, the radiation image capturing can be designed in such a way that the reading of leak data "d leak" is repeatedly performed before the radiation image capturing apparatus 1 is exposed to radiation. The leak data "d leak" is the data corresponding to the total value for each signal line 6 of the electric charge "q" leaking from each radiation detection element 7 through each of the TFTs 8 which is turned off with off-voltage applied to each scanning line 5, as shown in FIG. 11.

Figure 12:
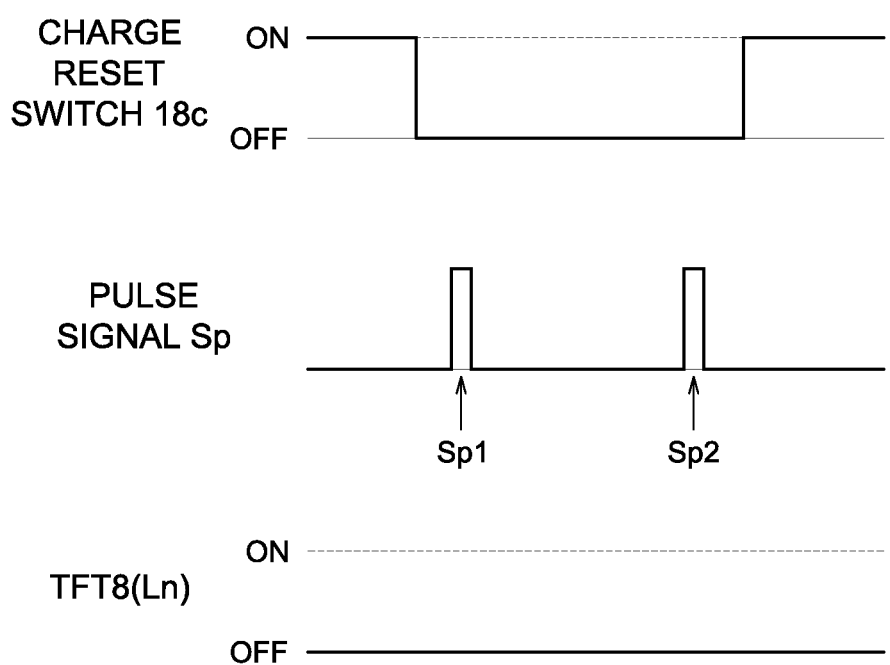
FIG. 12 is a timing chart showing the on-off timing of the charge reset switch and TFT in the step of reading the leak data.

In the step of reading the leak data "d leak", differently from the step of resetting of each radiation detection element 7 in FIG. 9 or the step of image data D reading in FIG. 10, off-voltage is applied to each of the lines L1 through Lx of the scanning line 5 so that each of the TFTs 8 is turned off, as shown in FIG. 12. Under this condition, pulse signals Sp1 and Sp2 are sent from the control device 22 to the correlated dual sampling circuit 19 (CDS of FIGS. 7 and 8) of each reading circuit 17.

When pulse signal Sp1 has been sent from the control device 22, the correlated dual sampling circuit 19 retains the voltage value Vin outputted from the amplification circuit 18 at this moment. The electric charge "q" leaking from each radiation detection element 7 is accumulated in the capacitor 18b of the amplification circuit 18 through each of the TFTs 8, and the voltage value outputted from the amplification circuit 18 is increased. When the pulse signal Sp2 has been sent from the control device 22, the correlated dual sampling circuit 19 retains the voltage value Vfi outputted from the amplification circuit 18 at this moment.

The value outputted by calculation of the difference Vfi−Vin of the voltage value by the correlated dual sampling circuit 19 is used as leak data "d leak". After that, the leak data "d leak" is converted into the digital value by the A/D conversion circuit 20, similarly to the step of the aforementioned reading of image data D.

Incidentally, if the configuration is so designed that only the step of reading the leak data "d leak" is repeated, each of the TFT 8 remains turned off, and the dark charge occurred in each radiation detection element 7 continues to be accumulated in each radiation detection element 7.

Figure 13:
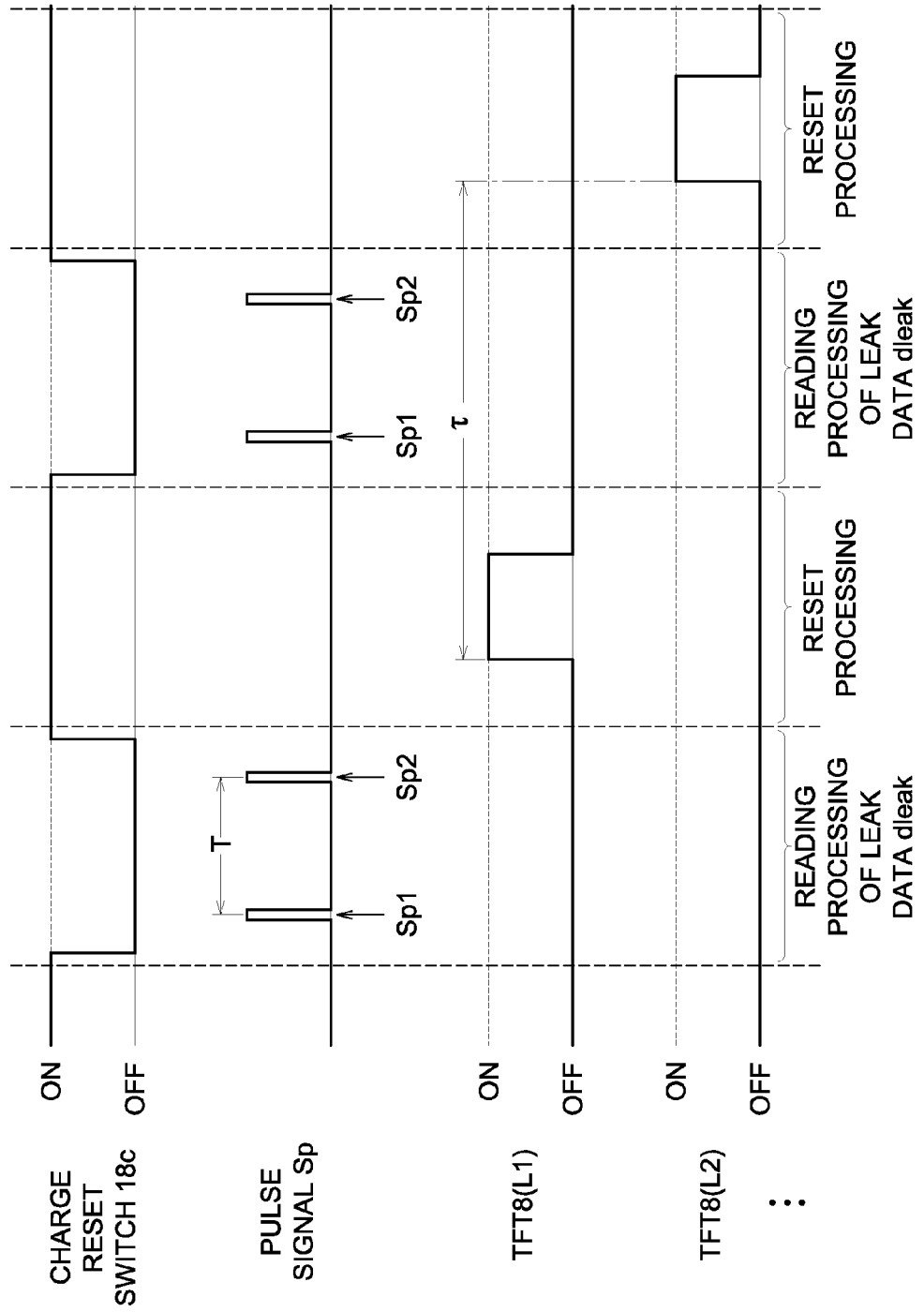
FIG. 13 is a timing chart showing the on-off timing of the charge reset switch, pulse signal and TFT when a step of reading the leak data and step of resetting each radiation detection element are performed on an alternate basis prior to radiation image capturing.

Therefore, as described above, if the structure is so configured that the step of reading the leak data "d leak" is repeated prior to the radiation image capturing operation, there is preferably an alternate repetition of the step of reading the leak data "d leak" to be performed with the off-voltage applied to each scanning line 5, and the step of resetting the radiation detection element 7 to be performed with the on-voltage applied sequentially to each of the lines L1 through Lx of the scanning line 5, as shown in FIG. 13. T and τ in FIGS. 13 and 14 will be described later.

As described above, if the configuration is so designed that the step of reading the leak data "d leak" and the step of resetting each radiation detection element 7 are performed on an alternate basis prior to radiation image capturing operation, the electromagnetic wave created by conversion from radiation by the scintillator 3 (FIG. 2) is applied to each of the TFTs 8, when the irradiation of the radiation image capturing apparatus 1 is started. This results in an increase in the volume of electric charge "q" (FIG. 11) leaking from each radiation detection element 7 through each of the TFTs 8, which was revealed by the research and development efforts of the present inventors.

Figure 14:
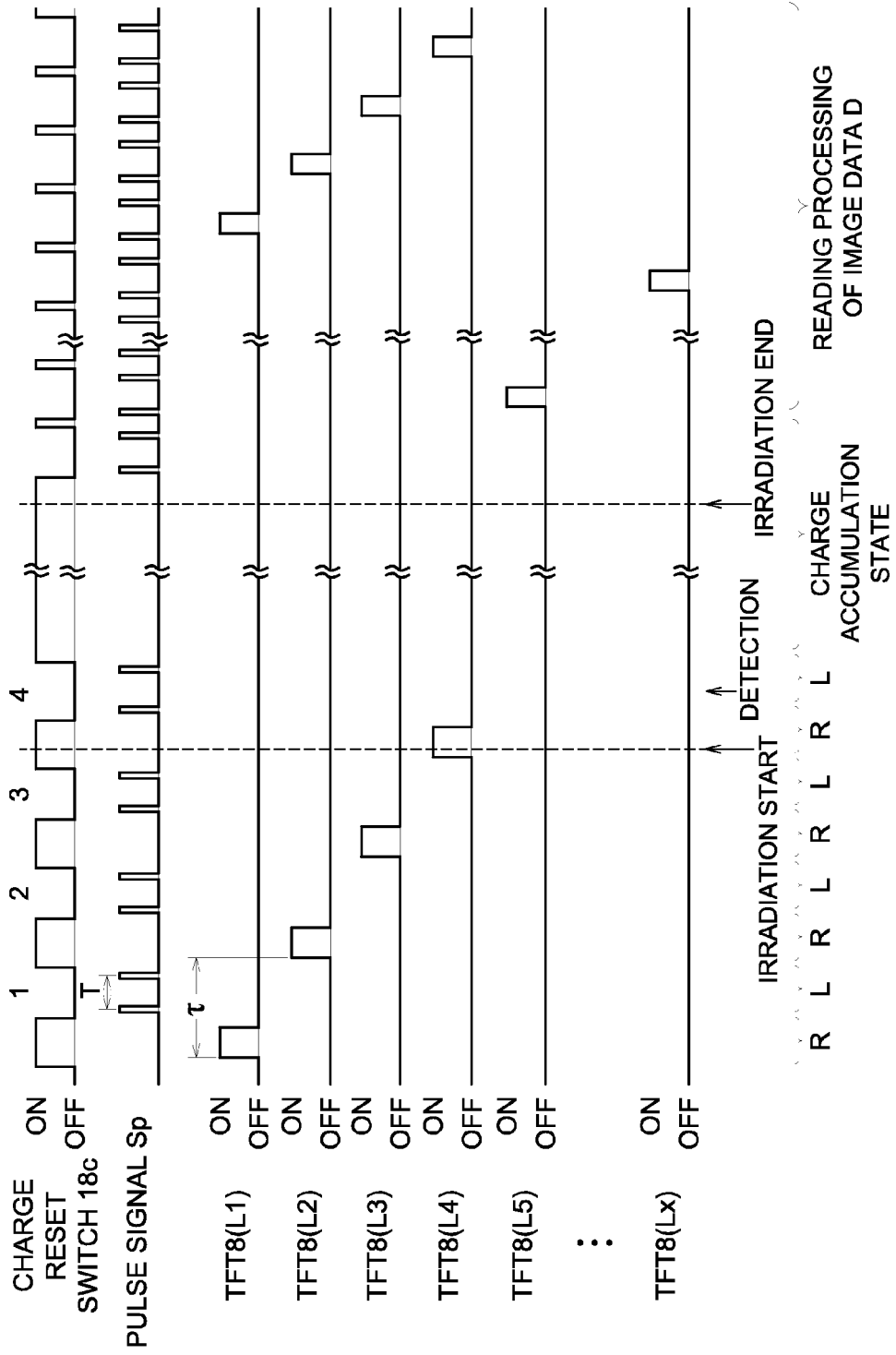
FIG. 14 is a timing chart showing the timing for applying on-voltage to each scanning line in the detection method 1.
Figure 15:
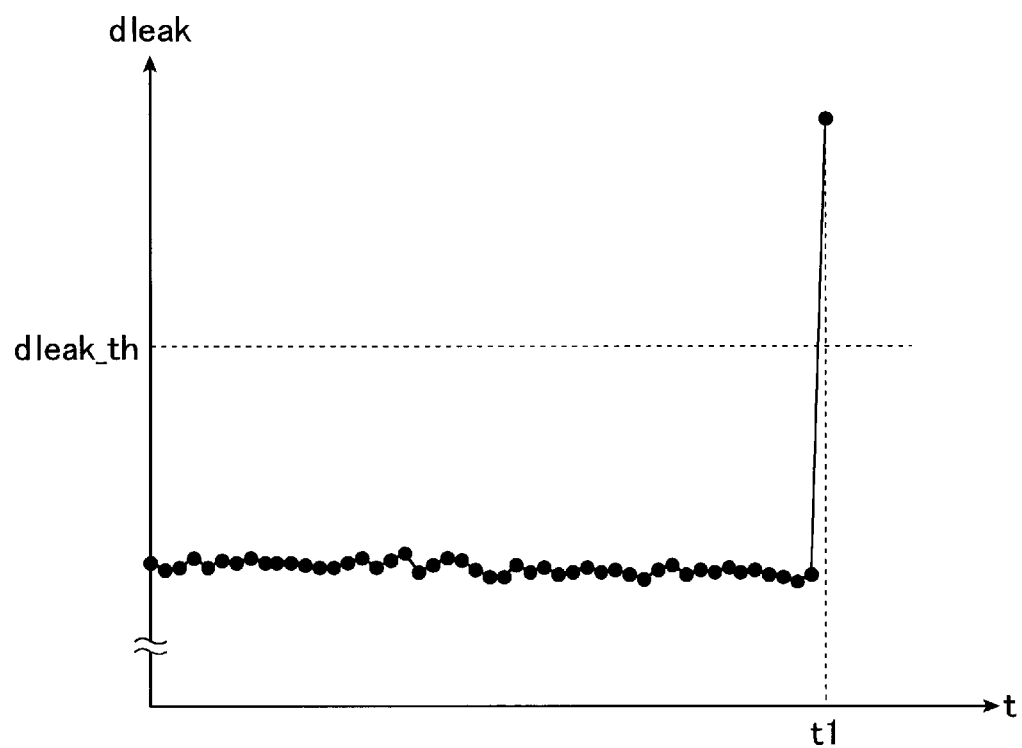
FIG. 15 is a chart in which the leak data having been read out is plotted in chronological order.

If the step of reading the leak data "d leak" and the step of resetting each radiation detection element 7 are repeated on an alternate basis prior to radiation image capturing operation, as shown in FIG. 14, the leak data "d leak" read out at the moment when the irradiation of the radiation image capturing apparatus 1 has started will be much greater than the leak data "d leak" read previously as shown in FIG. 15.

Regarding FIGS. 14 and 15, on-voltage is applied to the line L4 of the scanning line 5 in FIG. 14 and the step of resetting is performed. The leak data "d leak" having been read in the 4th reading operation corresponds to the leak data "d leak" at time "t1" of FIG. 15. Further, "R" in FIG. 14 represents the step of resetting each radiation detection element 7, and "L" denotes the step of reading the leak data "d leak".

It is possible to arrange such a configuration that the control device 22 of the radiation image capturing apparatus 1 monitors the leak data "d leak" having been read out in the step of reading the leak data "d leak" prior to radiation image capturing. Thus, when the leak data "d leak" having been read out has exceeded a prescribed threshold value "d leak_th" (FIG. 15) set in advance, the start of irradiation is detected.

In this case, when the control device 22 has detected the start of irradiation in the manner described above, application of on-voltage to each scanning line 5 is suspended at this moment, as shown in FIG. 14, and off-voltage is applied to all the lines L1 through Lx in the scanning line 5 from the gate driver 15b so that each of the TFTs 8 is turned off. Then the electric charge produced inside each radiation detection element 7 by irradiation is accumulated in each radiation detection element 7 so that the element is kept supplied with electric charges.

A prescribed time after detection of the start of irradiation, the control device 22 starts application of on-voltage to the scanning line 5 (line L5 of the scanning line 5 in FIG. 14) to which on-voltage is to be applied immediately after scanning line 5 (line L4 of the scanning line 5 in FIG. 14) to which on-voltage was applied at the time or immediately before the start of irradiation has been detected in the step of reading the leak data "d leak" prior to radiation image capturing. Thus, on-voltage is sequentially applied to each scanning line 5, and image data D as the main image is read.

FIG. 14 shows the case wherein application of on-voltage is started from line Ln+1 immediately after the line Ln of the scanning line 5 to which on-voltage has been applied, at the moment the start of irradiation has been detected, and the image data D as the main image is read. However, for example, it is also possible to arrange such a configuration that application of on-voltage is started from the first line L1 of the scanning line 5, and the image data D is read.

[Detection Method 2]

Figure 16:
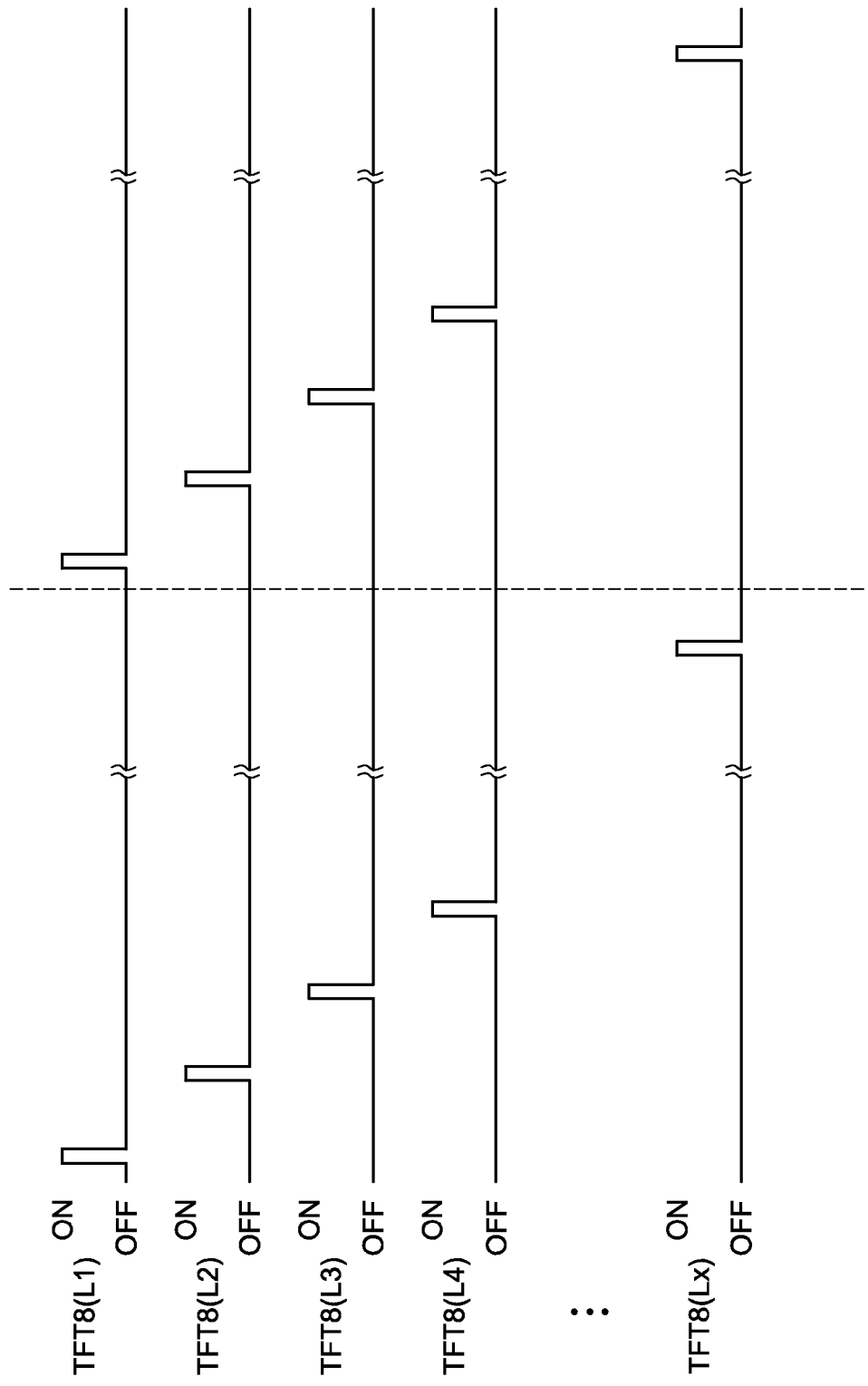
FIG. 16 is a timing chart showing the timing when on-voltage is sequentially applied to each scanning line, in the case where the step of reading the image data is repeated prior to radiation image capturing operation in the detection method 2.

Instead of the structure wherein the step of reading the leak data "d leak" is performed prior to the radiation image capturing operation as in the aforementioned detection method 1, it is possible to adopt such a structure that on-voltage is sequentially applied to each of the lines L1 through Lx of the scanning line 5 from the gate driver 15b of the scanning drive unit 15, prior to radiation image capturing operation, as shown in FIG. 16, so that the step of reading the image data "d" from each radiation detection element 7 is repeated.

As described above, in the following description, the image data to be read for detection of the start of irradiation prior to this radiation image capturing will be called image data "d" for irradiation start detection (or simply image data "d"), for distinction from the image data D as a main image to be read immediately after image capturing.

Figure 17:
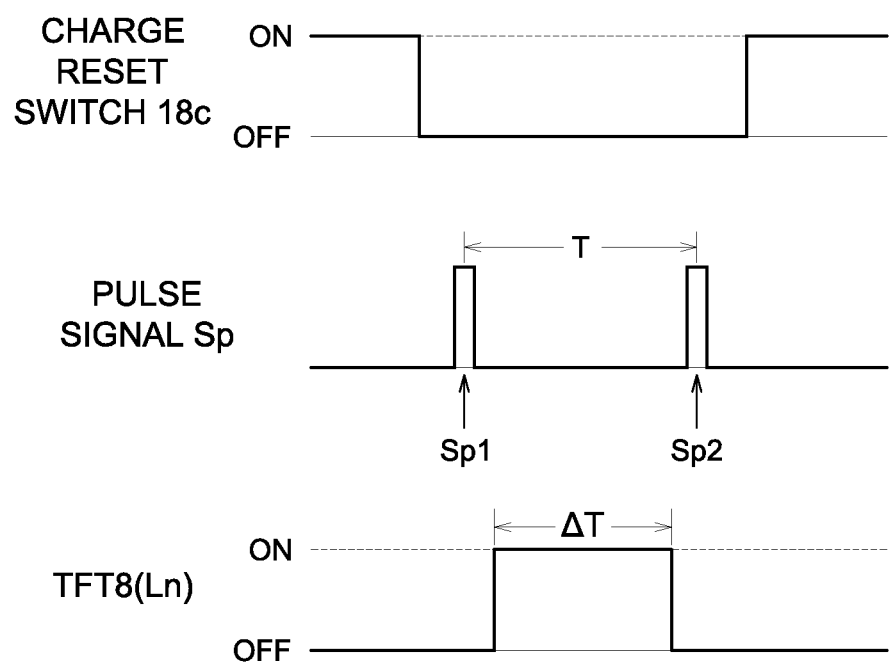
FIG. 17 is a timing chart showing the charge reset switch, pulse signal, on-off timing of the TFT and on-time ΔT in the step of reading the image data prior to radiation image capturing.

The on/off operation of the charge reset switch 18c of the amplification circuit 18 in the reading circuit 17 at the time of reading the image data "d" for irradiation start detection, and the transmission of the pulse signals Sp1 and Sp2 to the correlated dual sampling circuit 19 are performed as shown in FIG. 17 in the same procedure as that in the step of reading the image data D reading of FIG. 10. It should be noted that T and ΔT in FIG. 17 will be described later.

Figure 18:
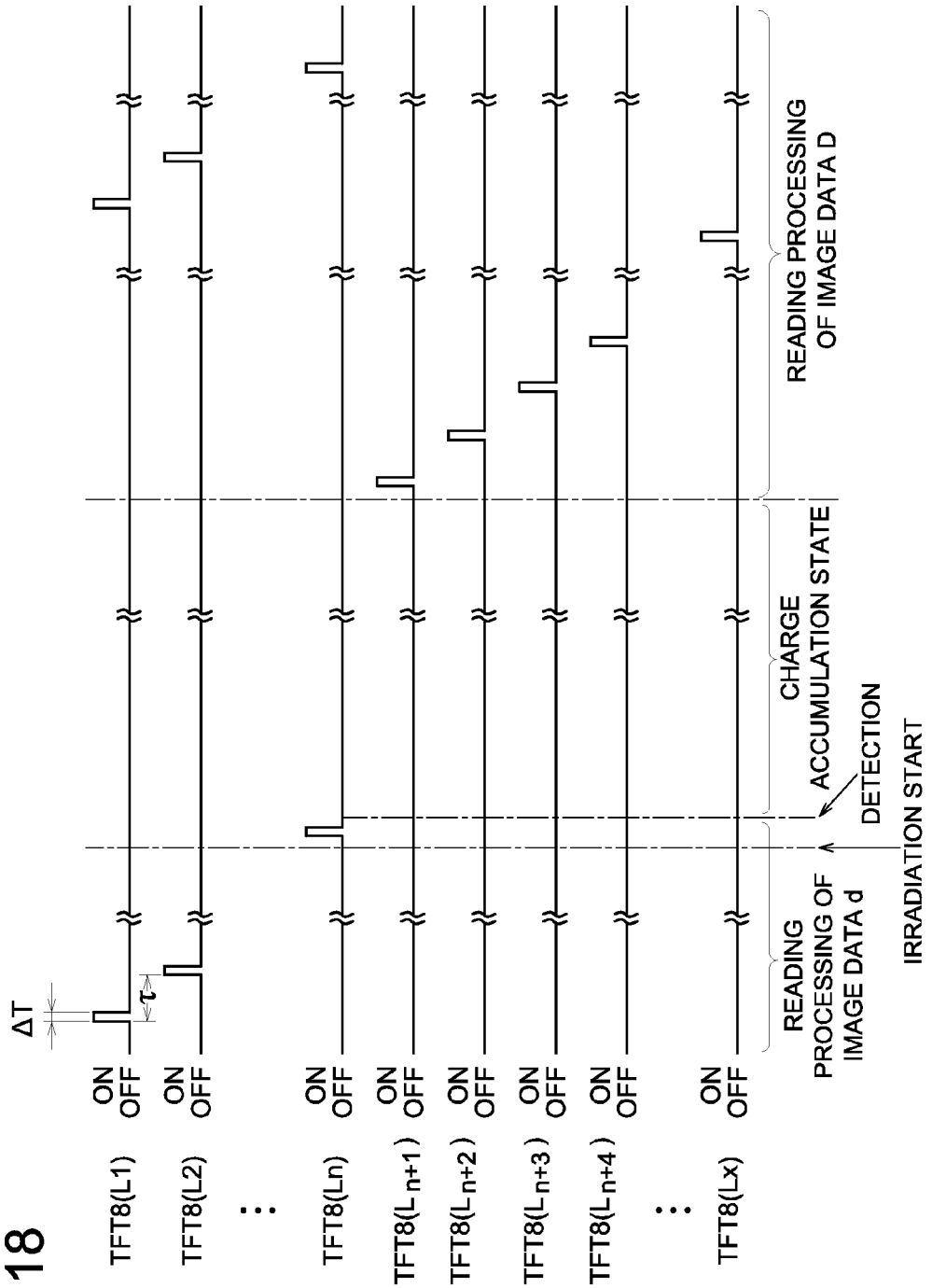
FIG. 18 is a timing chart showing the timing for applying on-voltage to each scanning line in the detection method 2.

As described above, if the structure is designed in such a way that the image data "d" for irradiation start detection is read prior to radiation image capturing operation, when irradiation of the radiation image capturing apparatus 1 has started as shown in FIG. 18, the value of the image data "d" (the image data "d" read out by application of the on-voltage to the line Ln of the scanning line 5 in FIG. 18) read out at this moment increases far over that value of the image data "d" read previously, similarly to the case of the leak data "d leak" shown in FIG. 15.

Accordingly, it is possible to arrange such a configuration that the image data "d" read out prior to radiation image capturing operation is monitored by the control device 22 of the radiation image capturing apparatus 1, and the start of irradiation is detected when the value of the image data "d" read out has exceeded a prescribed threshold value "dth" set in advance.

In this case, having detected the start of irradiation in the aforementioned procedure, the control device 22 suspends application of on-voltage to each scanning line 5 at this moment as shown in FIG. 18, and applies off-voltage to all the lines L1 through Lx of the scanning line 5 from the gate driver 15b so that each of the TFTs 8 is turned off. Then the electric charge produced inside each radiation detection element 7 by irradiation is accumulated in each radiation detection element 7 so that the element is kept supplied with electric charges.

When a prescribed time has passed after detection of the start of irradiation, the control device 22 starts application of on-voltage to the scanning line 5 (line Ln+1 of the scanning line 5 in FIG. 18) to which on-voltage is to be applied immediately after scanning line 5 (line Ln of the scanning line 5 in FIG. 18) to which on-voltage was applied at the time or immediately before the start of irradiation has been detected in the step of reading the image data "d" prior to radiation image capturing. Thus, on-voltage is sequentially applied to each scanning line 5, and image data D as the main image is read.

In the case of FIG. 18, it is also possible to arrange such a configuration that the image data D as the main image is read after application of on-voltage has been started from the first line L1 of the scanning line 5, for example. The ΔT and τ in FIG. 18 will be described later.

[Processing for Improving Detection Sensitivity]

In the detection method 1, in the step of resetting each radiation detection element 7 prior to radiation image capturing, the value of the leak data "d leak" to be read in a single step of reading the leak data "d leak" will be increased by prolonging the cycle τ (FIG. 13 and FIG. 14) from the start of application of on-voltage to one of scanning lines 5 to the start of on-voltage to the next scanning line 5, and by prolonging the transmission interval T between two transmissions of the pulse signals Sp1 and Sp2 sent from the control device 22. This will result in improvement of the sensitivity in detecting the start of irradiation of the radiation image capturing apparatus 1.

In the aforementioned detection method 2, in the step of reading the image data "d" for irradiation start detection prior to radiation image capturing, when the time ΔT of turning on each of the TFTs 8 (FIG. 17 and FIG. 18) is prolonged, namely, when the time ΔT (hereinafter referred to as on-time ΔT) from application of the on-voltage to the scanning line 5 from the gate driver 15b of the scanning drive unit 15 until the switching over to off-voltage from the on-voltage is prolonged, there will be an increase in the value of the image data "d" to be read out in a single step of reading image data "d". This will also result in improvement of the sensitivity in detecting the start of irradiation of the radiation image capturing apparatus 1.

This case also prolongs the time period τ (see FIG. 18) from the step of starting application of on-voltage to one scanning line 5 to the step of starting application of on-voltage to the next scanning line 5, and the transmission interval T (see FIG. 17) of two pulse signals Sp1 and Sp2 sent from the control device 22.

As described above, when the above-mentioned detection method 1 or detection method 2 is adopted, an appropriate step is taken to improve the sensitivity of detecting the start of irradiation in the radiation image capturing apparatus 1, for example, by prolonging the above-mentioned period τ in the step of resetting the radiation detection element 7 or in the step of reading out the image data "d" for detecting the start of irradiation prior to radiation image capturing operation, the transmission interval T of the two pulse signals Sp1 and Sp2 sent from the control device 22, or the on-time ΔT.

[Improved Method for Detecting the Start of Irradiation]

Incidentally, the aforementioned detection method A, namely detection methods 1 and 2 can be improved as follows. The following describes the aforementioned detection method 1 wherein the step of reading the leak data "d leak" and the step of resetting each radiation detection element 7 are alternately performed prior to radiation image capturing operation, and the start of irradiation is detected based on the leak data "d leak" having been read out. The description also similarly applies to the detection method 2.

When the aforementioned detection method 1 is utilized to detect the start of irradiation of the radiation image capturing apparatus 1, the detecting section P (FIG. 4 and FIG. 7) of the radiation image capturing apparatus 1 is normally connected with a few thousand through tens of thousands of signal lines 6. Each signal line 6 is provided with a reading circuit 17. Thus, the number of pieces of leak data "d leak" read out in a single step of reading the leak data "d leak" amounts to a few thousand through tens of thousands.

If, for all pieces of the leak data "d leak", a step is taken to determine if the aforementioned threshold value has been exceeded or not, the processing step will be extremely heavily loaded and the start of irradiation may not be detected on a real-time basis. To solve this problem, the following detection method can be adopted.

[Detection Method B]

For example, the reading IC 16 (FIG. 7) incorporates 128 or 256 reading circuits 17. To be more specific, one reading IC 16 is connected with 128 or 256 signal lines 6. In a single step of reading the leak data "d leak", 128 or 256 pieces of leak data "d leak" are read for each signal line 6 from one reading IC 16.

Assume that 8192 signal lines 6 are provided and one reading IC 16 incorporates 256 reading circuits 17 (i.e., one reading IC 16 is connected with 256 signal lines 6). Then, the total number of the reading ICs 16 is $8192/256=32$.

Thus, for example, it is also possible to adopt such a structure so as to calculate the mean value, total value, intermediate value and maximum value (hereinafter these values are collectively referred to as "statistics") of the leak data "d leak" outputted from one reading IC 16 in one step of reading the leak data "d leak", and to determine if the statistics "d leak_st (z)" of the leak data "d leak" calculated for each reading IC 16 has exceeded a threshold value or not.

The letter "z" in statistics "d leak_st(z)" denotes the number of the reading IC 16. Since thirty-two reading ICs 16 are provided, "z" assumes the number from 1 through 32 in the aforementioned example.

If the structure is designed in conformity to this, the control device 22 of the radiation image capturing apparatus 1 is not required to determine whether or not a threshold value has been exceeded for each of the 8192 pieces of leak data "d leak" read out in a single step of reading the leak data "d leak" in the aforementioned example. The control device 22 is only required to determine whether or not a threshold value has been exceeded for thirty-two statistics "d leak_st(z)" of the leak data "d leak" outputted from each reading IC 16. This arrangement reduces the load in determining the start of irradiation of the radiation image capturing apparatus 1.

[Detection Method C]

To reduce the load further in the decision step, it is possible to configure such a structure that the maximum value is selected out of the thirty-two statistics "d leak_st(z)" calculated from the leak data "d leak" outputted from each reading IC 16 in a single step of reading the leak data "d leak" by the control device 22. Then a step is taken to determine whether or not the maximum value of the statistics "d leak_st(z)" of the leak data "d leak" has exceeded a threshold value.

Figure 19:
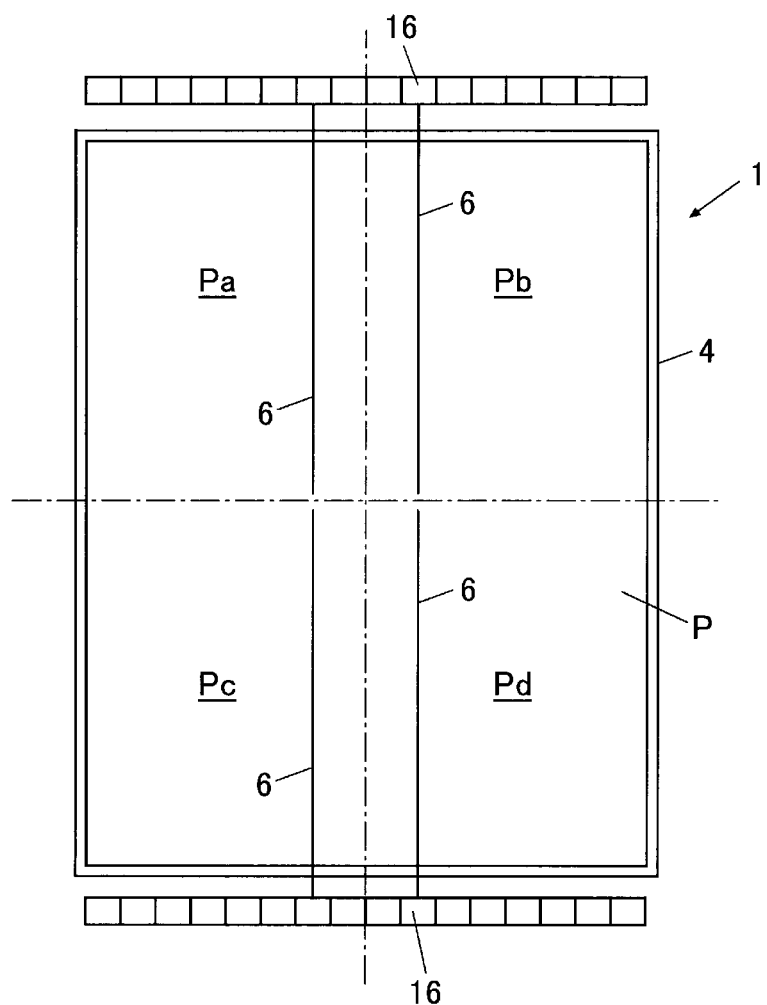
FIG. 19 is a diagram showing that the detecting section is divided into four regions and reading ICs are assigned to each region.

As shown in FIG. 19, the detecting section P (see FIG. 4 or 7) is divided into, for example, four regions Pa through Pd, and eight out of 32 reading ICs 16 ($32/4=8$) are assigned to each of the regions Pa through Pd, in some cases.

In such a case, it is also possible to make such arrangements that, in one step of reading the leak data "d leak" for each of the regions Pa through Pd, the maximum value is extracted from eight statistics "dleak_st(z)" calculated from the leak data "d leak" outputted from each reading IC 16, and a step is taken to determine whether the maximum value of the statistics "dleak_st(z)" of the leak data "d leak" has exceeded the threshold value or not.

In FIG. 19, illustrations of the scanning drive unit 15 and scanning line 5 are omitted. Further, each of the reading ICs 16 is connected with 256 signal lines 6, although they are simplified in FIG. 19.

However, the above-mentioned configuration, if it is implemented, may raise the problem of reducing the data reading efficiency in each of the reading circuits 17 in the reading ICs 16.

To be more specific, the data reading efficiency in each of the reading circuits 17 (see FIG. 7) is different for each of the reading circuits 17. Even if the total volume (FIG. 11) of the electric charge "q" leaking from radiation detection elements 7 to signal lines 6 is the same for each signal line 6, some reading circuits 17 always read the greater leak data "d leak" than the other reading circuits 17, while some other reading circuits 17 always read the smaller leak data "d leak" than the other reading circuit 17.

Figure 20:
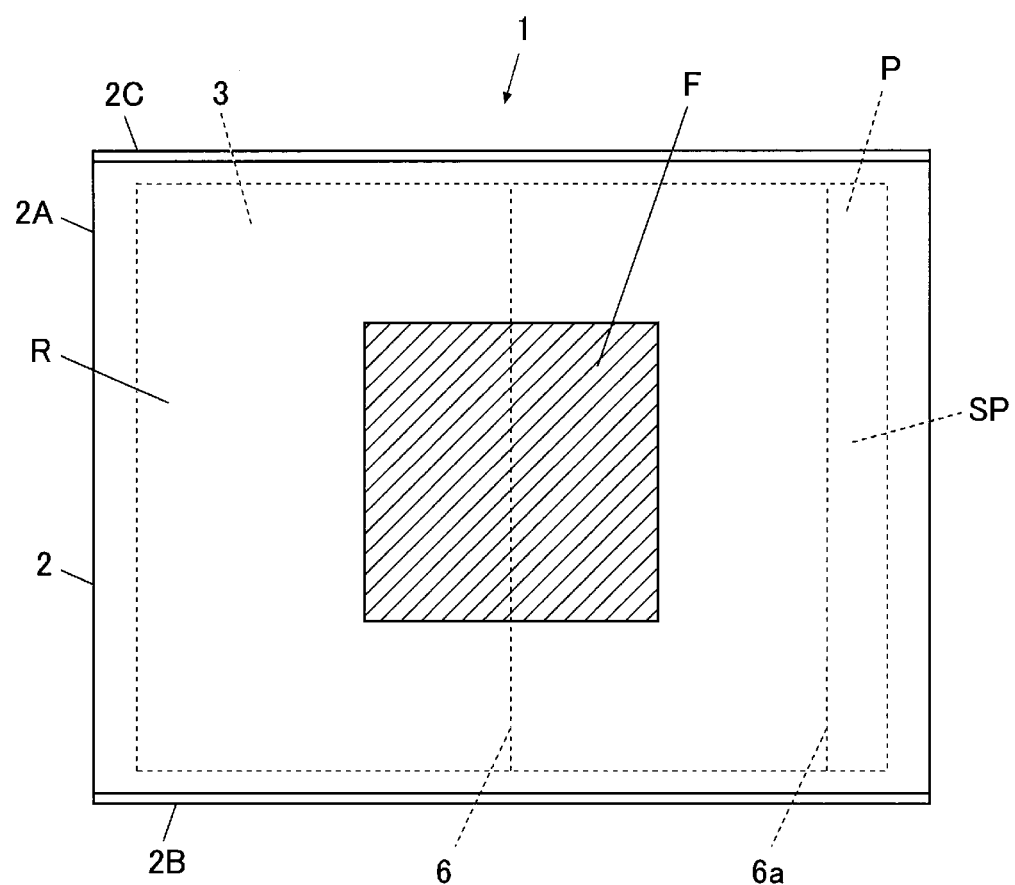
FIG. 20 is a diagram showing that radiation of limited irradiation field has been applied to the radiation image capturing apparatus.

Under this condition, assume, for example, that the radiation image capturing apparatus 1 is irradiated so that the irradiation field F is narrowed at the center of the detecting section P, and the signal line 6a connected to the reading circuit 17 for reading out the value of the leak data "d leak" always greater than that of other reading circuit 17 is located outside the irradiation field F, as shown in FIG. 20.

Figure 21:
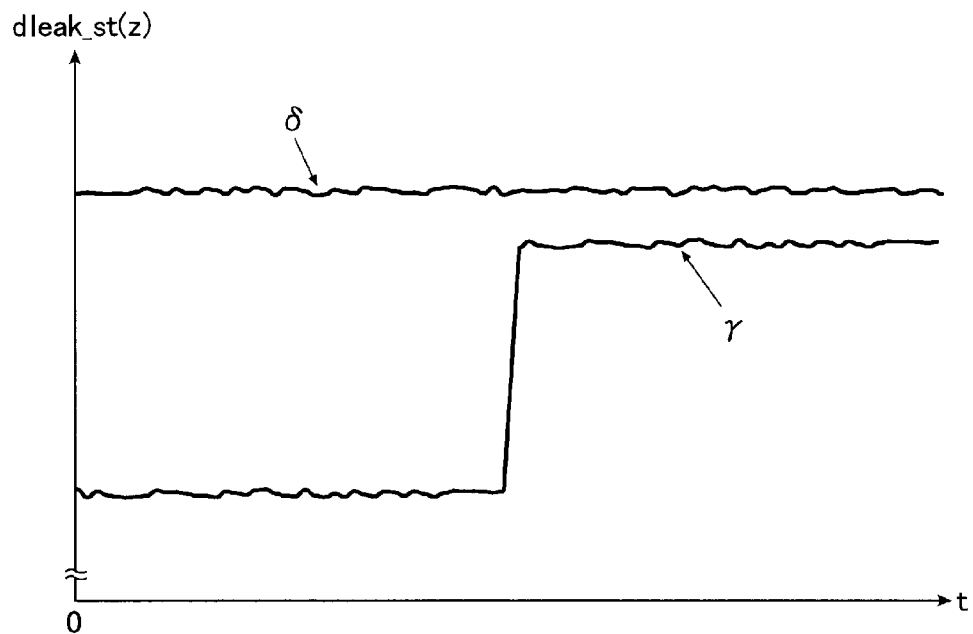
FIG. 21 is a chart showing an example of the temporal transition of the mean value of the leak data having been read by each reading circuit for each reading IC.

In this case, even if irradiation has caused an increase in the statistics "d leak_st(z)" (y of the drawing) of the leak data "d leak" outputted from the reading IC 16 including the reading circuit 17 connected to the signal line 6 located within the irradiation field F, as shown in FIG. 21, the statistics "d leak_st(z)" (δ of the drawing) of the leak data "d leak" outputted from the reading IC 16 including the reading circuit 17 connected to the signal line 6a located outside the irradiation field F is not exceeded by that of signal line 6 in some cases.

In such cases, if the maximum value is to be extracted out of statistics "d leak_st(z)" calculated from the leak data "d leak" outputted from each reading IC 16 in a single step of reading the leak data "d leak", the statistics "d leak_st(z)" of the leak data "d leak" indicated by δ in the drawing will be extracted. However, since the statistics "d leak_st(z)" of the leak data "d leak" having been extracted are free from fluctuation due to irradiation, a threshold value is not exceeded, and hence irradiation cannot be detected.

To solve such a problem, it is possible to adopt such a structure that the moving average "d lst_ma(z)" of the statistics "d leak_st(z)" of the leak data "d leak" outputted from each reading IC 16 for each step of reading is calculated for each reading IC 16. As calculation methods for the moving average "d lst_ma(z)", well-known methods such as a simple moving average, a weighted moving average or an index moving average method can be used.

Figure 22:
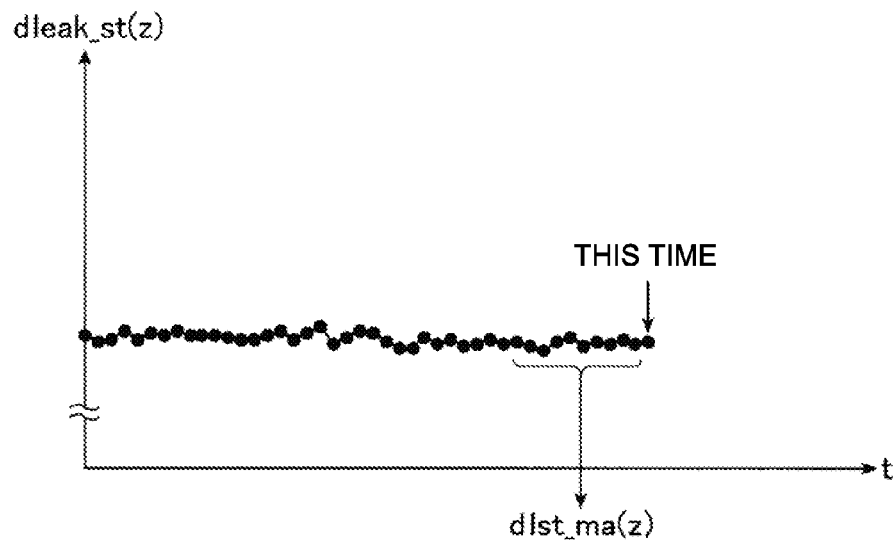
FIG. 22 is a chart showing how to calculate the moving average.

To be more specific, for example, a structure is so configured as to calculate the average (i.e., moving average "d lst_ma(z)") of the average of statistics "d leak_st(z)" of the leak data "d leak" for each reading IC 16 which has been calculated at the time of the previous step of reading out for a prescribed number of times (ten times for example) of reading, including the reading immediately before the current step of reading as shown in FIG. 22, every time the statistics "d leak_st(z)" of the leak data "d leak" outputted from the reading IC 16 is calculated in the step of reading the leak data "d leak".

The structure can be so designed as to calculate, for each reading IC 16, the difference Δd between statistics "d leak_st(z)" of the leak data "d leak" calculated in the current step of reading, and the calculated moving average "d lst_ma(z)" according to equation (1).

$$\Delta d(z) = d\,\text{leak}\_st(z) - d\,lst\_ma(z) \quad (1)$$

It is further possible to design the structure in such a way that the control device 22 calculates, for each reading IC 16, the difference Δd(z) between the statistics "d leak_st(z)" calculated from the leak data "d leak" outputted from the reading IC 16 in a single step of reading the leak data "d leak", and respectively corresponding moving averages "d lst_ma(z)". The control device 22 then calculates the maximum value Δdmax out of the calculated differences Δd (thirty-two or eight differences Δd(z) for the aforementioned example), and determines if the maximum value Δdmax of the difference Δd(z) has exceeded a threshold value or not.

This structure ensures that, even if there is a fluctuation in the reading efficiency for each of the reading circuits 17 provided inside the reading IC 16, the fluctuation in reading efficiency can be offset by calculating the difference Δd(z) between the statistics "d leak_st(z)" of the leak data "d leak" read with the equal reading efficiency, and the moving average "d lst_ma(z)".

That is to say, even if there is fluctuation in reading efficiency for each reading IC 16 as shown in FIG. 21, unless the radiation image capturing apparatus 1 is exposed to radiation, the calculated value of difference Δd(z) becomes nearly zero for any one of the reading IC 16.

Thus, the difference Δd(z) purely reflects the result of determining whether or not there is any increase in the statistics "d leak_st(z)" of the leak data "d leak" over the value of the previous data for each reading IC 16. If arrangement is so made to allow the start of irradiation to be detected based thereon, it is possible to prevent occurrence of the problem indicated with reference to FIG. 21.

This detection method C is adopted in the present embodiment. The control device 22 provides control in such a way that the difference Δd(z) between the statistics "dleak_st(z)" calculated from the leak data "d leak" outputted from the reading ICs 16 in the step of reading the leak data "d leak" performed prior to radiation image capturing operation and corresponding moving average "dlst_ma(z)" is calculated for each of the reading ICs 16. The maximum value Δdmax is extracted from the calculated differences Δd(z) (32 differences Δd(z) in the above-mentioned example or eight in FIG. 19). Then a decision step is taken to determine whether the maximum value Δdmax of the differences Δd(z) has exceeded the threshold value Δdth or not.

Figure 23:
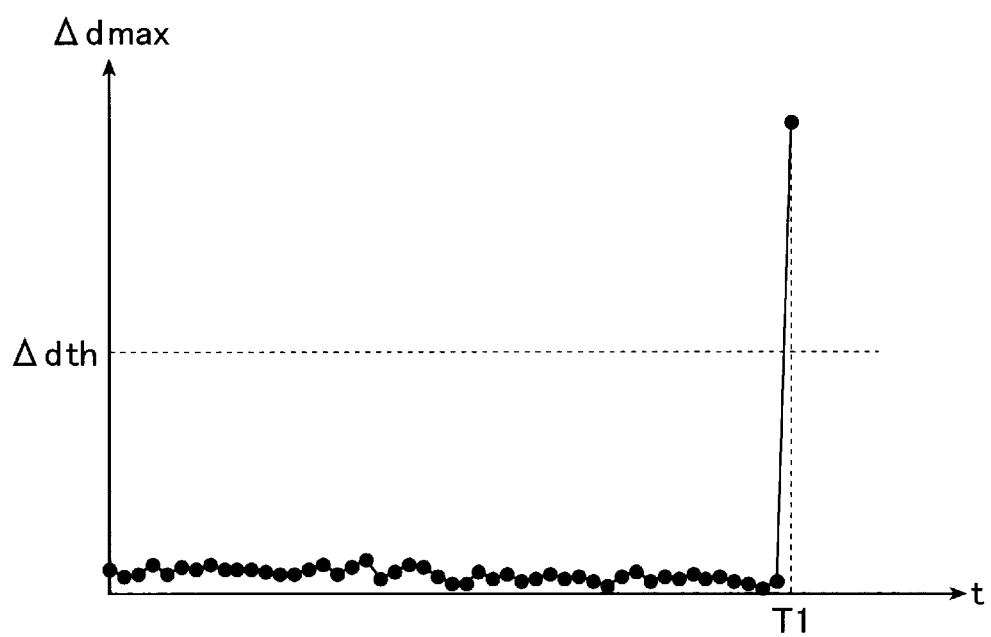
FIG. 23 is a diagram on which maximum values of differences calculated are chronologically plotted.

If this configuration is implemented, the difference Δd(z) calculated in any of the reading ICs 16 assumes to be the value of approximately 0 (zero) before radiation is applied to the radiation image capturing apparatus 1 as described above. Thus, the maximum value Δdmax of the difference Δd(z) calculated for each of reading ICs 16 assumes to be the value of approximately 0 (zero), as shown in FIG. 23 (before time T1 in FIG. 23).

When radiation is applied to the radiation image capturing apparatus 1 (time T1 in FIG. 23), the statistics "dleak_st(z)" of the leak data "d leak" read out in the read-out operation of this time is much greater than the moving average "dlst_ma(z)" (FIG. 22) of the statistics "dleak_st(z)" of the leak data "d leak" for each of the reading ICs 16, for example, in the last ten operations, in any one of the reading ICs 16 (or all reading ICs 16).

Thus, when the difference Δd(z) is calculated according to the aforementioned equation (1), there will be a reading IC 16 wherein the difference Δd(z) becomes much greater. Because the maximum value Δdmax of the difference Δd(z) surely exceeds the threshold value Δdth, the control device 22 is allowed to accurately detect the start of irradiation of the radiation image capturing apparatus 1.

When start of irradiation has been detected, application of the on-voltage to each scanning line 5 is suspended, and the apparatus transfers to the state of electric charge accumulation. After that, the image data D as the main image is read out as this structure has already been described (FIG. 14 and FIG. 18).

It is also possible to make such improved arrangements that, in the step of detecting the start of irradiation, the minimum value Δdmin of the differences Δd(z) as well as the maximum value Δdmax is calculated, as described above, and a decision step is taken to determine whether or not the difference between the maximum value Δdmax of the differences Δd(z) and the minimum value Δdmin has exceeded a threshold value.

Further, in the configuration wherein the start of irradiation is detected based on the leak data "d leak" itself read out of each reading circuit 17 as in the above-mentioned detection method A (e.g., detection method 1) without the statistics "dleak_st(z)" of the leak data "d leak" being calculated for each reading ICs 16, it is also possible to adopt such a configuration that the moving average "dleak_ma" of the leak data "d leak" is calculated for each reading circuit 17, and the difference Δd between the read-out leak data "d leak" and moving average "dleak_ma" is calculated for each step of reading, similarly to the case of the aforementioned equation (1).

When this configuration is adopted, the start of irradiation will be detected according to these differences Δd and the maximum value Δdmax extracted from these difference Δd. The following mainly describes the case where the detection method C has been adopted, as in the present embodiment. The same description applies to the above-mentioned detection methods A and B as well as their variations.

[Processing when the Leak Data or Others is Subjected to Periodic Fluctuation]

As a result of the present inventors making a further study on the step of detecting the start of irradiation, it has been revealed that there may be a periodic fluctuation in the value of leak data "d leak" and image data "d" for detecting the start of irradiation which are read out, while the radiation image capturing apparatus 1 is not exposed to radiation prior to radiation image capturing operation, as described above.

If there is such a periodic fluctuation in the values of the leak data "d leak", the image data "d" for detecting the start of irradiation or others which are read out, as described above, the threshold value may be exceeded when there is a big change in the leak data "d leak" or others even though the radiation image capturing apparatus 1 is not exposed to radiation. This may lead to incorrect detection of the start of irradiation, as revealed in the study.

The following describes processing in such cases as well as the operations of the radiation image capturing apparatus 1 in the present embodiment.

Figure 25:
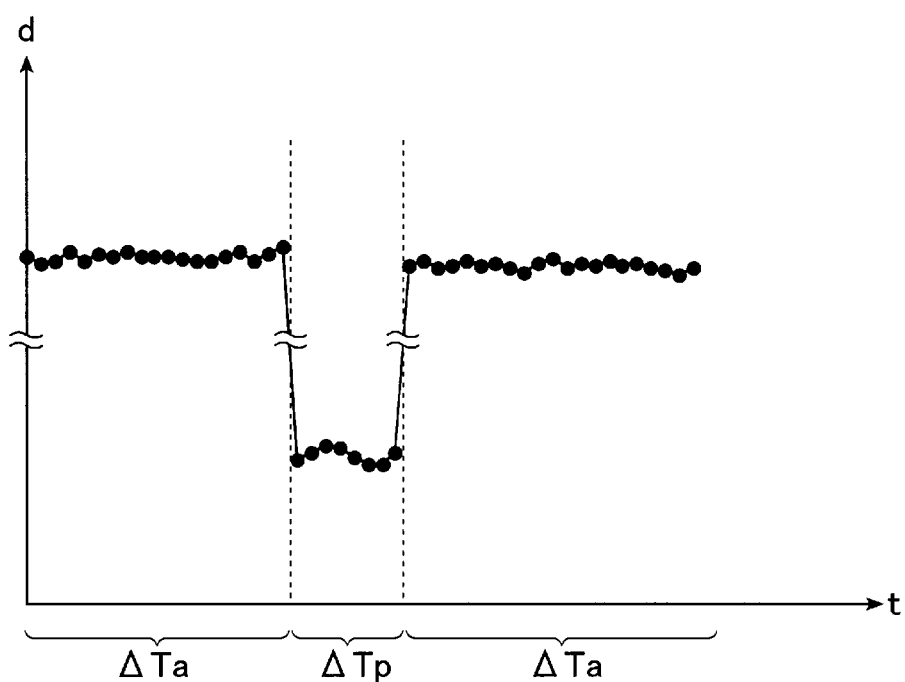
FIG. 25 is a chart showing a phenomenon that occurs when the gate driver includes a non-connection terminal.

To give a specific example wherein the above-mentioned phenomenon occurs, it has been found out that the above-mentioned phenomenon occurs when there is a so-called non-connection terminal "p" without the scanning line 5 being connected to the gate driver 15b of the scanning drive unit 15 or the gate IC 15c constituting the gate driver, for example, as shown in FIG. 25.

In the gate driver 15b, when the terminal to which on-voltage is applied is shifted, on-voltage is applied sequentially from the gate driver 15b to each of the lines L1 through Lx of the scanning line 5 (see FIG. 14, FIG. 18 and others, for example).

However, the terminal to which on-voltage is applied is shifted and then the on-voltage is applied to the non-connection terminal "p". During this state, on-voltage will not be applied to any of the scanning lines 5 because the non-connection terminal "p" is not connected with the scanning line 5. Meanwhile a state when off-voltage is applied to each scanning line 5 is maintained.

The case of the above-mentioned detection method 2 in considered by way of an example. During the state wherein on-voltage is sequentially applied to the terminals connected with the scanning lines 5, on-voltage will be sequentially applied to the scanning lines 5 connected with terminals. However, when on-voltage is applied to the non-connection terminal "p", it is the state where off-voltage is applied to each scanning line 5, as described above.

While on-voltage is sequentially applied to the non-connection terminal "p", reading operation is performed in the reading circuits 17 (refer to FIG. 7 and FIG. 8). Thus, the leak data "d leak" is practically being read in reading circuits 17 during this time.

Accordingly, as shown in FIG. 25, the value of the image data "d" for detecting the start of irradiation which is read out during the time period ΔTp will be reduced below the values of the image data "d" before and after the time period, namely, the value of the image data "d" read out during the time period ΔTa when on-voltage is sequentially applied to the terminals connected to the scanning lines 5, and is sequentially applied to each scanning line 5.

In the meantime, in the above-mentioned detection method 1, terminals of the gate driver 15b to which on-voltage is applied are shifted and on-voltage is sequentially applied to each of the lines L1 through Lx of the scanning line 5, thereby resetting the radiation detection element 7 (refer to FIG. 13 and FIG. 14). Further, in the leak data "d leak" reading process to be implemented alternately with the process of resetting, off voltage is applied to all the lines L1 through Lx of the scanning lines 5 and the process of reading is performed.

Thus, when on-voltage is sequentially applied to the lines L1 through Lx of the scanning line 5 and each radiation detection element 7 is reset and when on-voltage is applied to the non-connection terminal "p" of the gate driver 15b and each radiation detection element 7 is not subjected to the process of resetting in actual practice, there appears to be no change in the value of the leak data "d leak" to be read out because off-voltage is applied to all scanning lines 5.

In actual practice, however, regarding the leak data "d leak" read out in the process of reading the leak data "d leak" performed alternately with the process of resetting each radiation detection element 7, the value of the leak data "d leak" read out during the time period ΔTp when the on-voltage is applied to the non-connection terminal "p" in the process of resetting is known to be reduced below the value of the leak data "d leak" read out during the time periods ΔTa which is before and after the time period ΔTp and when the process of resetting the radiation detection element 7 is performed by sequential application of the on-voltage to each scanning line 5, similarly to the case of the above-mentioned image data "d" for detecting the start of irradiation (refer to FIG. 25) (see FIG. 28 A to be described later).

Figure 27:
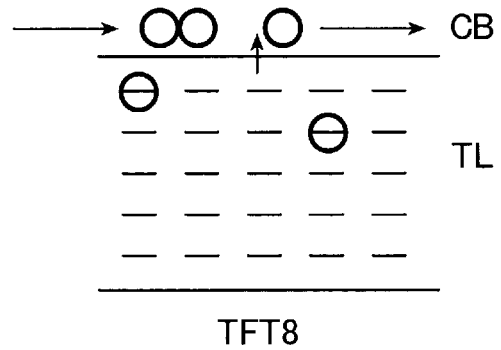
FIG. 27 is a diagram representing that, if each radiation detection element is not reset, the amount of electric charge trapped at the trap level of the TFT is reduced, with the result that the amount of electric charge transferred from the trap level to the conduction band is also reduced.

The cause for such a phenomenon is not completely clear. One of the causes being thought about is as follows. It should be noted that FIGS. 26A, 26B and 27 show the cases wherein electric charge flows to the TFT 18 from the radiation detection element 7 (not illustrated) on the left of the drawing, and electric charge flows out of the TFT 8 into the signal line 6 (not illustrated) on the right of the drawing. Further, the magnitude in the volume of the moving electric charge is indicated by the size of the arrow in the drawing.

When radiation detection element 7 has been reset by application of on-voltage to the terminal of the gate driver 15b connected to the scanning line 5, a greater amount of electric charge is discharged to the signal line 6 from the radiation detection element 7 through the conduction band CB of the TFT 8, as shown in FIG. 26A, and part of the electric charge is trapped at the trap level TL located in the band gap having smaller energy than the conduction band CB, and is kept within the TFT 8.

In the leak data "d leak" reading process performed alternately with the process of resetting each radiation detection element 7, part of the electric charge trapped at the trap level TL of the TFT 8, in addition to the electric charge leading into the signal line 6 from the radiation detection element 7 through the TFT 8, will move to the conduction band CB, and will be discharged to the signal line 6 if the TFT 8 is kept off, as shown in FIG. 26B. This increases the value of the leak data "d leak" read out.

In the process of resetting each radiation detection element 7 as the next process, electric charge is again supplied to the trap level TL of the TFT 8 and is trapped. This ensures that the value of the leak data "d leak" read out in the process of reading the leak data "d leak" as the next process is maintained at a larger value.

The terminals of the gate driver 15b to which on-voltage is applied will be shifted, and a state will occur where each radiation detection element 7 is not reset in actual practice when the on-voltage is to be applied to the non-connection terminal "p". If this state has been reached, electric charge is not supplied by resetting to the trap level TL of the aforementioned TFT.

This reduces the volume of the electric charge trapped at the travel level TL of the TFT 8, as shown in FIG. 27. This, in turn, will reduce the volume of the electric charge moving to the conduction band CB from the trap level TL. Thus, even if the volume of the electric charge leaking from the radiation detection element 7 itself remains unchanged, the volume of the electric charge discharged to the signal line 6 is reduced by the reduction in the volume of the electric charge moving to the conduction band CB from the trap level TL. This is considered to cause a relative reduction in the value of the leak data "d leak" to be read out.

Each terminal of the gate driver 15b to which on-voltage is applied is further shifted, and when on-voltage is applied to each terminal connected with each scanning line 5 and the process of resetting each radiation detection element 7 has started, the supply of electric charge to the trap level TL of the TFT 8 by resetting will be resumed, as described above. Then the value of the leak data "d leak" read out goes back to the original greater value.

If there are periodic fluctuations in the leak data "d leak" or the value of the image data "d" for detecting the start of irradiation to be read out prior to radiation image capturing operation as described above, the following problem may arise.

Figure 28A:
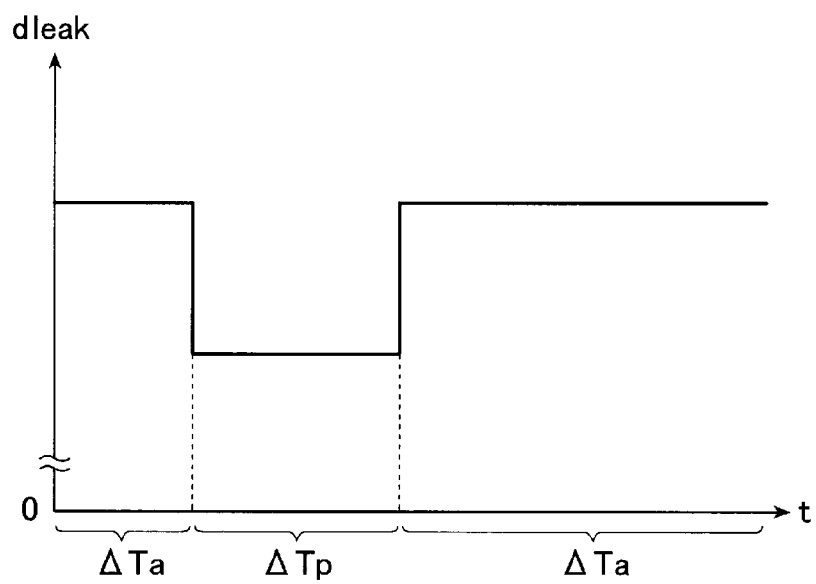
FIG. 28A is a chart showing periodic fluctuations of the leak data and FIG. 28B is a chart showing periodic fluctuations of moving average.
Figure 28B:
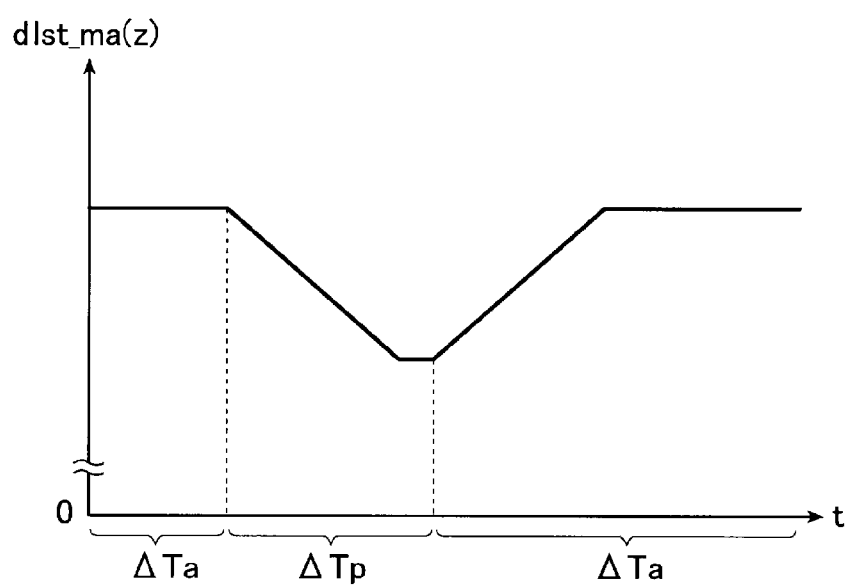

If there are periodic fluctuations in the leak data "d leak" as shown in FIG. 28A, a fluctuation occurs to the moving average "dlst_ma(z)" of the statistics "dleak_st(z)" such as the average value of the leak data "d leak" for each of the above-mentioned reading ICs 16 for example, as shown in FIG. 28B during the time period $\Delta Tp$ when the leak data "d leak" undergoes fluctuation or immediately thereafter. In this case, the difference $\Delta d(z)$ (or the maximum value $\Delta dmax$ of the difference $\Delta d(z)$) calculated according to the aforementioned equation (1) undergoes a fluctuation as shown in FIG. 29.

Figure 29:
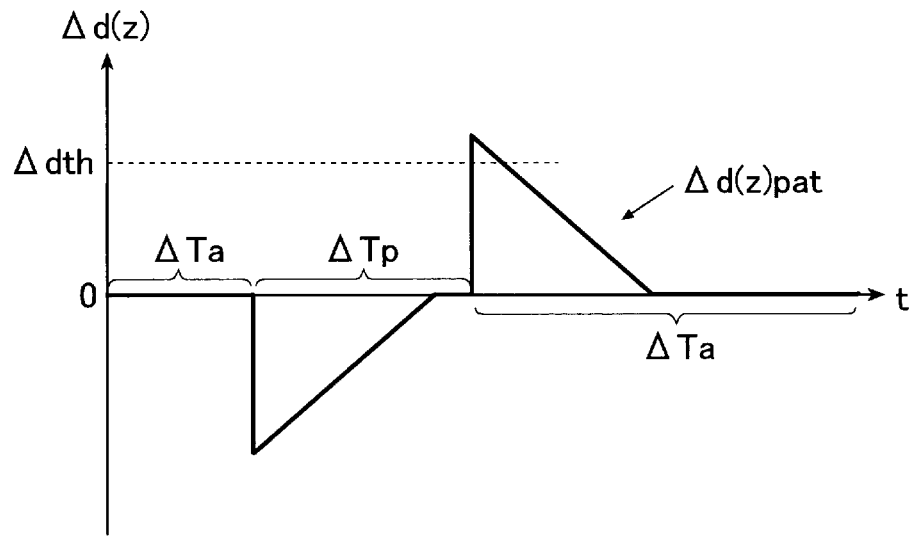
FIG. 29 is a chart representing the periodic fluctuations of difference and a fluctuation pattern of the difference.

As described above, if there are periodic fluctuations in the leak data "d leak" (FIG. 28A) to be read out in the read-out process or the value of the image data "d" for detecting the start of irradiation (FIG. 25) prior to radiation image capturing operation, the difference $\Delta d(z)$ will fluctuate and will exceed the threshold value $\Delta dth$ when the difference $\Delta d(z)$ has fluctuated to a great value, as shown in FIG. 29. This may cause incorrect detection of the start of irradiation even though radiation is not applied to the radiation image capturing apparatus 1.

In the present embodiment, if there are periodic fluctuations in the read-out leak data "d leak" or image data "d" for detecting the start of irradiation although radiation is not applied as described above, the control device 22 acquires in advance the fluctuation pattern of the difference $\Delta d(z)$ during at least the time period when difference $\Delta d(z)$ fluctuates, that is, during the above-mentioned time period $\Delta Tp$ and a time period immediately thereafter (FIG. 29), namely, the fluctuation pattern $\Delta d(z)$pat of the difference $\Delta d(z)$ given in FIG. 29, in the above-mentioned example.

The fluctuation pattern $\Delta d(z)$pat of the difference $\Delta d(z)$ can be acquired, for example, when the radiation image capturing apparatus 1 is shipped from the factory or is introduced into facilities such as hospitals.

This fluctuation pattern $\Delta d(z)$pat is known to be changed, for example, in conformity to the temperature within the casing 2 (FIG. 1 and FIG. 2) of the radiation image capturing apparatus 1. To be more specific, a rise of temperature is known to increase the range of the fluctuation pattern $\Delta d(z)$ pat. Thus, it is possible to mange such a configuration as to acquire the fluctuation pattern $\Delta d(z)$pat of the difference $\Delta d(z)$ for each radiation image capturing operation.

To be more specific, after the start of the process of resetting each radiation detection element (in the detection method 1) which is performed together with the process of reading the leak data "d leak" prior to radiation image capturing operation or the process of reading the image data for detecting the start of irradiation (in the detection method 2) for each radiation image capturing operation, the control device 22 acquires the fluctuation pattern $\Delta d(z)$pat during at least the time period $\Delta Tp$ when on-voltage is applied to the non-connection terminal "p" of the gate driver 15b and the time period immediately thereafter, before the irradiation starts.

This configuration preferably ensures acquisition of the fluctuation pattern $\Delta d(z)$pat of the difference $\Delta d(z)$ under the condition in conformity to the current temperature or others inside the casing 2 of the radiation image capturing apparatus 1 in the actual image capturing operation.

In this case, if configuration is so designed that the above-mentioned fluctuation pattern $\Delta d(z)$pat is acquired several times, and the average of the acquired values or the like is calculated, variations in the fluctuation patterns $\Delta d(z)$pat occurring for each step of acquisition can be minimized. Further, it is also possible to adopt such a structure that the above-mentioned fluctuation pattern $\Delta d(z)$pat of the difference $\Delta d(z)$ can be obtained not only during the above-mentioned time period $\Delta Tp$ and time period immediately thereafter, but also during all the time periods when on-voltage is sequentially applied to the terminals of the gate driver 15b including the non-connection terminal "p".

When the start of irradiation is detected not only based on the difference $\Delta d(z)$ but also based on the value of the original leak data "d leak" itself (FIG. 28A) and the value of the image data "d" for detecting the start of irradiation itself (FIG. 25) as in the present embodiment, the value may exhibit a sudden increase to exceed the threshold value "d leak_th", for example, when the value of the leak data "d leak" or others goes back to an original relatively greater value through a shift from the time period $\Delta Tp$ to the time period $\Delta Ta$.

Thus, even when the start of irradiation is to be detected based on the value of the original leak data "d leak" itself or others, the fluctuation pattern (e.g., FIG. 28A) "d leak_pat" of the leak data "d leak" or others should preferably be obtained in advance so that the same processing as that described below can be performed.

In the meantime, after having read out the leak data "d leak" prior to radiation image capturing operation as described above, the control device 22 calculates the statistics "d leak_st(z)" of the outputted leak data "d leak" for each of the reading ICs 16 and also calculates the moving average d lst_ma(z) thereof.

In the present embodiment, when calculating the difference $\Delta d(z)$ between the statistics "d leak_st(z)" of the leak data "d leak" and the moving average "d lst_ma(z)" having been calculated in the aforementioned procedure, the control device 22 subtracts the fluctuation pattern $\Delta d(z)$pat of the difference $\Delta d(z)$ acquired in advance in the aforementioned procedure, from the calculated difference $\Delta d(z)$ in conformity to the following equation (2) during at least the time period when the difference $\Delta d(z)$ fluctuates (i.e., the above-mentioned time period $\Delta Tp$ and the time period immediately thereafter):

$$\Delta d(z)^* = \Delta d(z) - \Delta d(z)pat \qquad (2)$$

It is also possible to make such arrangements so as to subtract the fluctuation pattern $\Delta d(z)$pat of the difference $\Delta d(z)$ at the same time that the difference $\Delta d(z)$ is calculated in conformity to the aforementioned equation (1), as shown in the following equation (3).

$$\Delta d(z)^* = d\,\mathrm{leak\_}st(z) - d\,\mathrm{lst\_}ma(z) - \Delta d(z)pat \qquad (3)$$

In the present embodiment, the control device 22 determines whether irradiation has started or not, by checking if the value $\Delta d(z)^*$ calculated in this manner has exceeded the threshold value or not.

Figure 30:
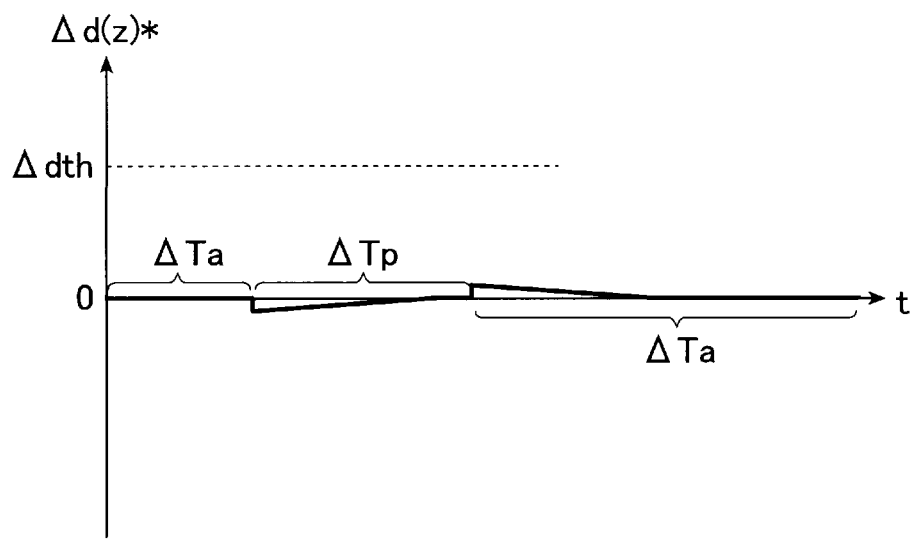
FIG. 30 is a chart representing that the value obtained by subtracting the fluctuation pattern of the previously obtained difference from the calculated difference is approximately 0 (zero).

Even if the above-mentioned difference $\Delta d(z)$ is fluctuated by the periodic fluctuations of leak data "d leak" or others, as shown in FIG. 29 for example, without the radiation image capturing apparatus 1 being exposed to radiation, this configuration ensures that the value $\Delta d(z)^*$ obtained by subtracting the previously obtained fluctuation pattern $\Delta d(z)$pat of the difference $\Delta d(z)$ from the calculated difference $\Delta d(z)$ is assumed to be close to 0 (zero), as shown in FIG. 30.

As described above, the fluctuation pattern $\Delta d(z)$ of the difference $\Delta d(z)$ that changes similarly to the difference $\Delta d(z)$ is subtracted, though the fluctuation of the difference $\Delta d(z)$ occurs, with the result that difference $\Delta d(z)$ and fluctuation pattern $\Delta d(z)$pat cancel out each other. When the radiation image capturing apparatus 1 is not exposed to radiation, the above-mentioned value $\Delta d(z)^*$ can be calculated as the value that is close to 0 (zero) without exhibiting any conspicuous change.

Further, when the radiation image capturing apparatus 1 starts to be exposed to radiation, the leak data "d leak" or the like to be read has a value much greater than that of the leak data "d leak" or the like having been read out previously (FIG. 15). Thus, the difference $\Delta d(z)$ calculated in the aforementioned procedure has a value much greater than the fluctuation in the fluctuation pattern $\Delta d(z)$pat of the difference $\Delta d(z)$ obtained when radiation is not applied, as described above.

Thus, the value $\Delta d(z)^*$ to be calculated will reach a much greater level, although this is not illustrated, with the result that the threshold value $\Delta dth$ is clearly exceeded. Thus, if the above-mentioned configuration is adopted, the start of irradiation of the radiation image capturing apparatus 1 can be accurately detected when such irradiation has actually started.

If the configuration is so arranged that the above-mentioned fluctuation pattern $\Delta d(z)$pat corresponding to the difference $\Delta d(z)$, the original leak data "d leak", image data "d" for detecting the start of irradiation and others is subtracted therefrom as described above, the calculated value $\Delta d(z)^*$ or the like is correctly reduced below the threshold value $\Delta dth$ when the radiation image capturing apparatus 1 is not exposed to radiation. When irradiation of the radiation image capturing apparatus 1 has started, the threshold value $\Delta dth$ is exceeded correctly.

Thus, even if there are periodic fluctuations in the leak data "d leak" to be read prior to radiation image capturing operation or in the image data "d" for detecting the start of irradiation, the start of irradiation can be correctly detected when radiation image capturing apparatus 1 has been exposed to radiation. Further, if the radiation image capturing apparatus 1 is not exposed to radiation, this configuration provides an accurate means for avoiding incorrect detection of the start of irradiation.

As described above, according to the radiation image capturing apparatus 1 of the present embodiment, if there are periodic fluctuations in the leak data "d leak" to be read out prior to radiation image capturing operation or in the image data "d" for detecting the start of irradiation even when the radiation image capturing apparatus 1 is not exposed to radiation, the control device 22 ensures that the fluctuation pattern $\Delta d(z)$pat of the leak data "d leak", image data "d" or difference $\Delta d(z)$ is acquired in advance during the time period including at least the time period $\Delta Tp$ when the leak data "d leak" or image data "d" is subjected to fluctuation.

Further, the control device 22 determines the start of irradiation by checking whether or not threshold value has been exceeded by the value $\Delta d(z)^*$ or the like obtained by subtracting the above-mentioned previously obtained fluctuation pattern $\Delta d(z)$pat or the like from the leak data "d leak", image data "d" read out prior to radiation image capturing operation or difference $\Delta d(z)$.

The value $\Delta d(z)^*$ or the like obtained by subtracting the fluctuation pattern $\Delta d(z)$pat or the like from the leak data "d leak", image data "d" or difference $\Delta d(z)$ is ensured to be reduced below the threshold value when the radiation image capturing apparatus 1 is not exposed to radiation, and is ensured to exceed the threshold value when the irradiation to the radiation image capturing apparatus 1 has started.

Thus, even if there are periodic fluctuations in the leak data "d leak" or in the image data "d" for detecting the start of irradiation to be read prior to radiation image capturing operation, the start of irradiation is correctly detected when the radiation image capturing apparatus 1 has been exposed to radiation. Further, this configuration provides an accurate means for avoiding incorrect detection of the start of irradiation if the radiation image capturing apparatus 1 is not exposed.

As described above, according to the radiation image capturing apparatus 1 of the present embodiment, incorrect detection of the start of irradiation is prevented without fail. Thus, this configuration provides a reliable means for avoiding unwanted execution of a series of processing such as shift to the state of electric charge accumulation or reading of the image data D as the main image, due to incorrect detection of the start of irradiation.

When the radiation image capturing apparatus 1 has a built-in battery 24 as in the present embodiment, reliable means are provided to avoid unwanted power consumption by the shift to the state of electric charge accumulation or reading of the image data D as the main image due to incorrect detection, with the result that consumption of the battery 24 is prevented in a reliable manner. Thus, this structure correctly prevents reduction in the number of radiographic images that can be captured in one charging operation of the battery 24, with the result that image capturing efficiency per a charging operation is enhanced.

If the configuration is so arranged that the start of irradiation is detected based on the difference $\Delta d(z)$ calculated according to the equation (1) or the value $\Delta d(z)^*$ calculated by subtracting the fluctuation pattern $\Delta d(z)$pat from the difference $\Delta d(z)$ according to the equations (2) and (3) as in the above-mentioned embodiment, the difference $\Delta d(z)$ or value $\Delta d(z)^*$ assumes to be a value close to 0 (zero), as described above. This allows the threshold value $\Delta dth$ (FIG. 23 and FIG. 29) to be set to a small value.

If the threshold value $\Delta dth$ can be set to a smaller value, accurate detection of the start of irradiation is ensured even when the radiation to be applied is weak (i.e., radiation having a smaller dose rate) or the patient as a subject is so fat that the radiation reaching the radiation image capturing apparatus 1 is reduced.

Figure 24:
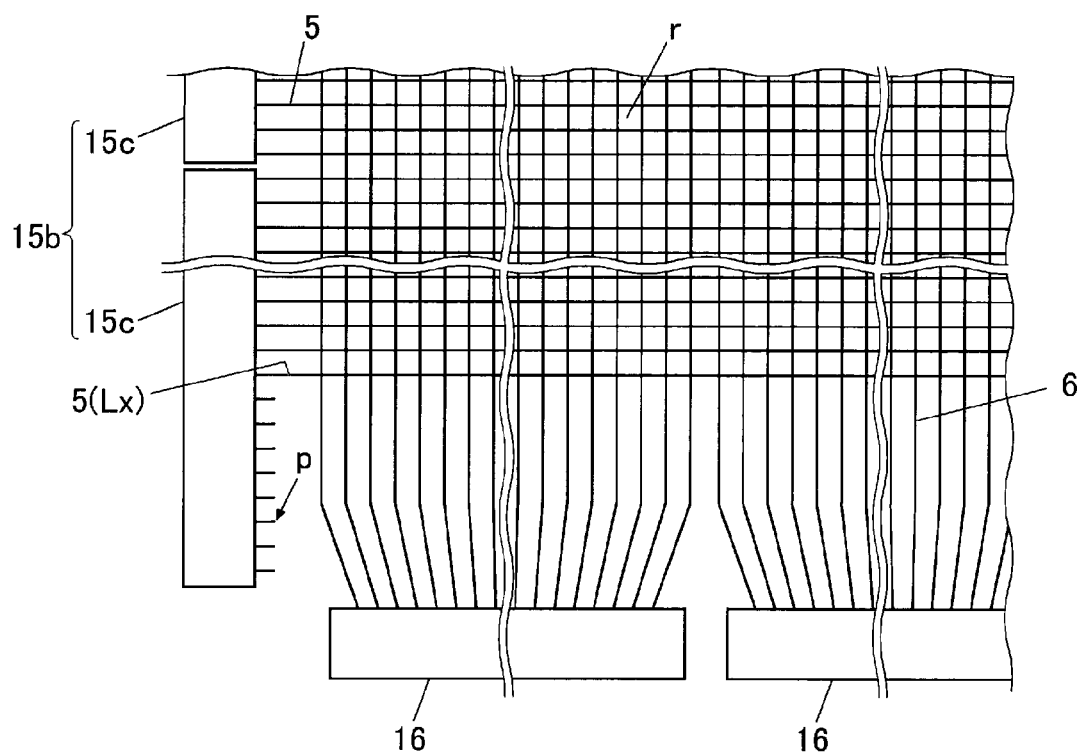
FIG. 24 is a diagram representing the non-connection terminal located in the gate driver.

Further, in the description of the above-mentioned embodiment, reference has been made to the case where, when on-voltage is applied to each terminal of the gate driver 15b of the scanning drive unit 15, on-voltage is also applied to the non-connection terminal "p" (FIG. 24). This configuration, however, causes waste of power.

To avoid this, terminals of the gate driver 15b are sequentially activated. On-voltage is applied only when the terminal connected with the scanning line 5 has been activated, according to some configuration. If this configuration is adopted, on-voltage is not applied when the non-connection terminal "p" is active.

Even when a gate driver 15b having such a configuration is used, in the leak data "d leak" (FIG. 28A) or image data "d" for detecting the start of irradiation (FIG. 25) to be read out prior to radiation image capturing operation during the time period $\Delta Tp$ when the non-connection terminal "p" is active, these values are below the value during the time period ΔTa before and after the time period ΔTp. The value of the difference Δd(z) calculated from these values (FIG. 29) is also subjected to periodic fluctuation during the time period including the time period ΔTp.

Thus, the present invention is also applicable when the gate driver 15b is designed in this configuration, and provides exactly the same advantages as those described above.

In the description of the above-mentioned embodiment, reference has been made to the case when the gate driver 15b is provided with the non-connection terminal "p", and periodic fluctuations occur to the leak data "d leak" or the image data "d" for detecting the start of irradiation to be read prior to radiation image capturing operation or difference Δd(z) calculated based thereon.

In addition, when a cable Ca is connected to the connector 39 of the radiation image capturing apparatus 1 and AC voltage, for example, is supplied to the radiation image capturing apparatus 1 from the external power source as shown in FIG. 3, periodic fluctuations may occur to the leak data "d leak" or in the image data "d" for detecting the start of irradiation to be read out, in response to the cycle of the AC voltage.

In this manner, periodic fluctuations may occur to the leak data "d leak", the image data "d" for detecting the start of irradiation to be read prior to the radiation image capturing operation or the difference Δd(z) and the like calculated based thereon, in some cases in addition to the case of the present embodiment. Also in these cases, the present invention can be employed to get the same advantages as those described above.

According to the radiation image capturing apparatus of the configuration in the embodiment of the present invention, the value obtained by subtracting the fluctuation pattern from the leak data "d leak", image data "d" for detecting the start of irradiation to be read prior to the radiation image capturing operation, or the like is ensured to be reduced below the threshold value when the radiation image capturing apparatus is not exposed to radiation and the value is ensured to exceed the threshold value when irradiation to the radiation image capturing apparatus has started.

Thus, even if there are periodic fluctuations in the leak data "d leak" or the image data "d" for detecting the start of irradiation to be read prior to the radiation image capturing operation, accurate detection of the start of irradiation is ensured when the irradiation to the radiation image capturing apparatus has started. Further, if the radiation image capturing apparatus is not exposed to radiation, this configuration provides an accurate means for avoiding incorrect detection of the start of irradiation.

Thus, a reliable means is provided to prevent unwanted execution of a series of processing such as a shift to the state of electric charge accumulation or reading of the image data D as the main image, due to incorrect detection of the start of irradiation. Further, when the radiation image capturing apparatus has a built-in battery, this prevents the battery from being exhausted by unwanted waste of power in a series of processing such as the state of electric charge accumulation or reading of the image data D as the main image, due to incorrect detection. Thus, this structure correctly prevents reduction in the number of radiographic images that can be captured in one charging operation of the battery, with the result that image capturing efficiency per a charging operation is enhanced.

What is claimed is:
1. A radiation image capturing apparatus comprising:
a detecting section including:
a plurality of scanning lines and a plurality of signal lines provided to cross each other; and
a plurality of radiation detection elements arranged in a two-dimensional array in small regions partitioned by the plurality of scanning lines and the plurality of signal lines;
a scanning drive unit which sequentially applies on-voltage to each of the scanning lines by switching the scanning lines to which the on-voltage is applied;
switch units each connected to each of the scanning lines so as to discharge electric charge accumulated in the radiation detection elements to the signal lines when the on-voltage is applied;
reading circuits, which are connected to the plurality of signal lines and which convert the electric charge discharged from the radiation detection elements into image data, to read out the image data; and
a control device for controlling at least the scanning drive unit and the reading circuits to perform reading out the image data from the radiation detection elements,
wherein the control device is configured to allow the reading circuits to repeat reading out data prior to radiation image capturing operation so as to detect a start of irradiation when the data read out by the reading circuits exceeds a threshold value; and
wherein when the data read out prior to the radiation image capturing operation fluctuates periodically even though the irradiation has not started, the control device determines whether or not a value obtained by subtracting a previously obtained fluctuation pattern of the data from the read-out data has exceeded a threshold value, during a time period prior to the radiation image capturing operation including at least a time period when the data fluctuates.

2. The radiation image capturing apparatus of claim 1, wherein the control device is configured to allow the reading circuits to repeat reading out leak data prior to the radiation image capturing operation by converting the electric charge having leaked from each of the radiation detection elements through the switch units into the leak data after turning off each of the switch units by allowing the scanning drive unit to apply off-voltage to all of the scanning lines, and the control device is configured to detect the start of irradiation when the leak data read out by the reading circuits has exceeded the threshold value, and
wherein when the leak data read out prior to the radiation image capturing operation fluctuates periodically even though the irradiation has not started, the control device determines whether or not the value obtained by subtracting a previously obtained fluctuation pattern of the leak data from the read-out leak data has exceeded the threshold value, during the time period including at least the time period when the leak data fluctuates.

3. The radiation image capturing apparatus of claim 1, wherein the control device is configured to allow the reading circuits to repeat reading out image data for detecting a start of irradiation prior to the radiation image capturing operation by allowing the scanning drive unit to sequentially apply on-voltage to each of the scanning lines, and detects the start of irradiation when the read-out image data for detecting the start of irradiation has exceeded the threshold value, and
wherein when the image data for detecting the start of irradiation read out prior to the radiation image capturing operation fluctuates periodically even though the irradiation has not started, the control device determines whether or not the value obtained by subtracting a previously obtained fluctuation pattern of the image data for detecting the start of irradiation from the read-out image data for detecting the start of irradiation has exceeded the threshold value, during the time period including at least the time period when the image data for detecting the start of irradiation fluctuates.

4. The radiation image capturing apparatus of claim 2 wherein the control device executes alternately the reading out the leak data and resetting each of the radiation detection elements prior to the radiation image capturing operation, the resetting being conducted by allowing the scanning drive unit to apply on-voltage sequentially to the scanning lines.

5. The radiation image capturing apparatus of claim 1, wherein the scanning drive unit comprises a gate driver having a non-connection terminal to which the scanning lines are not connected, and in the reading out the data prior to the radiation image capturing operation, the control device determines whether or not the threshold value has been exceeded by the value obtained by subtracting the previously obtained fluctuation pattern of the data from the read-out data, during the time period including at least a time period when on-voltage is applied to the non-connection terminal of the gate driver or when the non-connection terminal is activated.

6. The radiation image capturing apparatus of claim 4 wherein the scanning drive unit comprises a gate driver having a non-connection terminal to which the scanning lines are not connected, and in the resetting each of the radiation detection elements, which is performed together with the reading out the leak data prior to the radiation image capturing operation, the control device determines whether or not the threshold value has been exceeded by the value obtained by subtracting the previously obtained fluctuation pattern of the leak data from the read-out leak data, during the time period including at least a time period when on-voltage is applied to the non-connection terminal of the gate driver or when the non-connection terminal is activated.

7. The radiation image capturing apparatus of claim 1, wherein, when having started the reading out the data for the radiation image capturing operation, the control device acquires the fluctuation pattern during a time period including at least the time period, before the irradiation starts.

8. The radiation image capturing apparatus of claim 5, wherein, when having started the reading out the data prior to the radiation image capturing operation, the control device acquires the fluctuation pattern during a time period including at least a time period when on-voltage is applied to the non-connection terminal of the gate driver or when the non-connection terminal is activated, before the irradiation starts.

9. The radiation image capturing apparatus of claim 6, wherein, when having started the resetting each of the radiation detection elements, which is performed together with the reading out the leak data prior to the radiation image capturing operation, the control device acquires the fluctuation pattern during a time period including at least a time period when on-voltage is applied to the non-connection terminal of the gate driver or when the non-connection terminal is activated, before the irradiation starts.

10. The radiation image capturing apparatus of claim 1 further comprising:
a plurality of reading ICs each having a prescribed number of the reading circuits which are built therein,
wherein the control device calculates a statistic of the data whose number is the prescribed number and which are outputted from each of the reading ICs in one reading out the data prior to the radiation image capturing operation, and determines whether or not a threshold value has been exceeded by the statistic of the data calculated for each of the reading ICs.

11. The radiation image capturing apparatus of claim 10, wherein the control device calculates a difference between the statistic of the data calculated for each of the reading ICs and a moving average of statistics for each of the reading ICs, each of the statistics having been calculated at each time of a prescribed number of times of past reading processing including one reading processing immediately before the reading out, and the control device determines whether or not the difference has exceeded a threshold value.

12. The radiation image capturing apparatus of claim 11, wherein, when the difference calculated prior to the radiation image capturing operation fluctuates periodically even though the irradiation has not started, the control device determines whether or not a threshold value has been exceeded by a value obtained by subtracting a previously obtained fluctuation pattern of the difference from the calculated difference during a time period including at least a time period when the difference fluctuates.

* * * * *